United States Patent
An et al.

(10) Patent No.: US 10,483,932 B2
(45) Date of Patent: Nov. 19, 2019

(54) METHOD FOR AMPLIFYING AUDIO SIGNAL BASED ON ITS AMPLITUDE AND ELECTRONIC DEVICE SUPPORTING THE SAME

(71) Applicant: Samsung Electronics Co., Ltd, Suwon-si (KR)

(72) Inventors: Jungyeol An, Seoul (KR); Jongmo Keum, Seoul (KR); Beakkwon Son, Yongin-si (KR); Seungyoon Heo, Yongin-si (KR); Gangyoul Kim, Seongnam-si (KR); Yangsu Kim, Suwon-si (KR); Chulmin Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/101,315

(22) Filed: Aug. 10, 2018

(65) Prior Publication Data

US 2019/0052240 A1 Feb. 14, 2019

(30) Foreign Application Priority Data

Aug. 11, 2017 (KR) .................. 10-2017-0102604

(51) Int. Cl.
| | |
|---|---|
| *H04R 3/00* | (2006.01) |
| *H03G 3/20* | (2006.01) |
| *H03G 3/32* | (2006.01) |
| *H03G 3/30* | (2006.01) |
| *H03G 7/00* | (2006.01) |

(Continued)

(52) U.S. Cl.
CPC ............. *H03G 3/32* (2013.01); *H03G 3/3005* (2013.01); *H03G 7/002* (2013.01); *H03G 9/025* (2013.01); *H04R 3/007* (2013.01); *H04R 3/04* (2013.01); *H04R 2430/03* (2013.01)

(58) Field of Classification Search
CPC . H04R 3/00; H04R 3/04; H04R 3/007; H04R 29/00; H04R 2430/01; H04R 2430/03; G06F 3/165; H03G 7/002; H03G 3/32; H03G 3/3005; H03G 9/025
See application file for complete search history.

(56) References Cited

U.S. PATENT DOCUMENTS

| | | | | |
|---|---|---|---|---|
| 2004/0114769 A1* | 6/2004 | Little | ..................... | H03G 9/005 |
| | | | | 381/71.11 |
| 2009/0060209 A1* | 3/2009 | Takeishi | ................... | H04R 3/04 |
| | | | | 381/17 |

(Continued)

FOREIGN PATENT DOCUMENTS

| | | |
|---|---|---|
| KR | 10-2013-0133541 A | 12/2013 |
| KR | 10-2015-0122759 A | 11/2015 |
| KR | 10-2015-0122760 A | 11/2015 |

*Primary Examiner* — Thang V Tran

(57) ABSTRACT

An electronic device includes a processor. The processor is configured to examine the sound level of an audio signal obtained from an external object for a preset time; change, if the frequency with which the sound level becomes higher than or equal to a specified level satisfies a preset condition, a reference level, at which the gain value for audio signal amplification is changed in accordance with the amplitude change of the audio signal, for at least one section of the audio signal satisfying the preset condition; and amplify the at least one section of the audio signal according to the changed reference level.

20 Claims, 12 Drawing Sheets

(51) Int. Cl.
*H03G 9/02* (2006.01)
*H04R 3/04* (2006.01)

(56) References Cited

U.S. PATENT DOCUMENTS

| | | | |
|---|---|---|---|
| 2010/0154619 A1* | 6/2010 | Taub | G10H 1/00 84/616 |
| 2011/0002481 A1* | 1/2011 | Suzuki | H03G 3/3005 381/107 |
| 2012/0177208 A1* | 7/2012 | Fukuda | H05B 37/0227 381/56 |
| 2012/0321104 A1* | 12/2012 | Kemmerer | H03G 3/301 381/107 |
| 2013/0028445 A1* | 1/2013 | Lee | H03G 7/002 381/107 |
| 2013/0322652 A1 | 12/2013 | Kudryavtsev et al. | |
| 2014/0023208 A1* | 1/2014 | Oh | H03F 3/217 381/107 |
| 2014/0294200 A1 | 10/2014 | Baumgarte et al. | |
| 2014/0297291 A1 | 10/2014 | Baumgarte | |
| 2017/0048615 A1* | 2/2017 | Son | H03G 3/3005 |

* cited by examiner

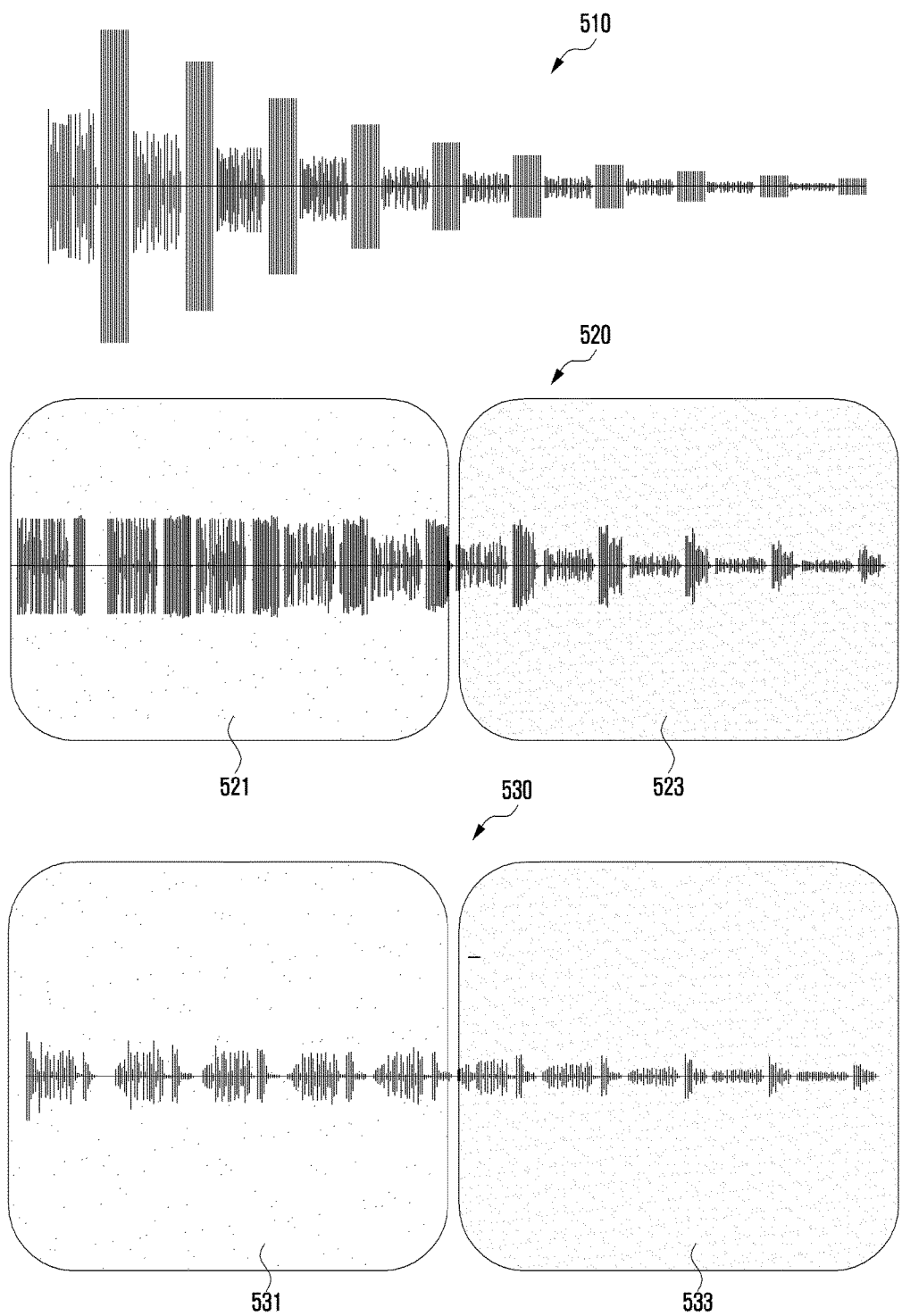

METHOD FOR AMPLIFYING AUDIO SIGNAL BASED ON ITS AMPLITUDE AND ELECTRONIC DEVICE SUPPORTING THE SAME

CROSS-REFERENCE TO RELATED APPLICATION AND CLAIM OF PRIORITY

This application is based on and claims priority under 35 U.S.C. § 119 to Korean Patent Application No. 10-2017-0102604 filed on Aug. 11, 2017 in the Korean Intellectual Property Office, the disclosure of which is incorporated by reference herein in its entirety.

BACKGROUND

1. Field

Various embodiments according to the present disclosure relate to an electronic device capable of processing an obtained audio signal adaptively depending on the situation, and an audio signal processing method for the electronic device.

2. Description of Related Art

In recent years, electronic devices can process audio signals in various ways for users. For example, an electronic device can receive an audio signal from an external object and store or process the received audio signal to provide it to the user. In this process, to prevent the amplitude of the audio signal from exceeding a preset threshold (e.g., clipping), the electronic device can compress the audio signal according to a preset gain. That is, various electronic devices are using dynamic range control techniques to compress audio signals.

However, when an audio signal is compressed, the audio signal may fail to retain the original waveform and may be distorted. As a result, the sound quality may be degraded.

SUMMARY

Embodiments according to the present disclosure address the above-described problem. Accordingly, an aspect of the present disclosure is to provide an electronic device that can output a high-quality audio signal without clipping by amplifying the obtained audio signal at an appropriate gain based on the state (e.g. energy distribution) of the audio signal, and an audio signal processing method for the electronic device.

Certain embodiments according to the present disclosure provide an electronic device including a processor. The processor may be configured to: examine the sound level of an audio signal obtained from an external object for a preset time; change, if the frequency with which the sound level becomes higher than or equal to a specified level satisfies a preset condition, a reference level, at which the gain value for audio signal amplification is changed in accordance with the amplitude change of the audio signal, for at least one section of the audio signal satisfying the preset condition; and amplify the at least one section of the audio signal according to the changed reference level.

Some embodiments according to the present disclosure provide an electronic device including a processor. The processor may be configured to: examine the sound level of an audio signal obtained from an external object for a preset time; amplify, if the examined sound level meets a first specified level, the section of the audio signal whose sound level corresponds to the first specified level at a first specified gain; and change, if the examined sound level meets a second specified level, a reference level for the transition from the first specified gain to a second specified gain less than the first specified gain for the section of the audio signal where the sound level corresponds to the second specified level, and amplify at least a portion of the audio signal that meets the changed reference level of the section corresponding to the second specified level at the second specified gain.

Various embodiments according to the present disclosure provide a method of audio signal processing for an electronic device. The method may include: examining the sound level of an audio signal obtained from an external object for a preset time; changing, if the frequency with which the sound level becomes higher than or equal to a specified level satisfies a preset condition, a reference level for the transition from a first specified gain to a second specified gain, for the section of the audio signal whose sound level corresponds to the specified level; and amplifying at least a portion of the audio signal that meets the changed reference level of the section corresponding to the specified level at the second specified gain.

In various embodiments according to this disclosure, the electronic device and audio signal processing method therefor can dynamically change the reference level for applying different gain values depending on the state of the input audio signal (e.g., energy distribution).

In some embodiments according to this disclosure, an electronic device and audio signal processing method therefor can provide higher quality audio by processing the audio signal adaptively according to the surrounding environment.

In certain embodiments according to this disclosure, an electronic device and audio signal processing method therefor can provide higher quality audio without clipping by processing the audio signal according to specified frequency bands.

In various embodiments according to this disclosure, an electronic device and audio signal processing method therefor can provide a high-quality audio signal while preventing clipping by amplifying (compressing) the audio signal based on a parameter that is optimized adaptively according to the situation.

Before undertaking the DETAILED DESCRIPTION below, it may be advantageous to set forth definitions of certain words and phrases used throughout this disclosure: The terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5 illustrates results of audio signal processing;

DETAILED DESCRIPTION

Figure 1:
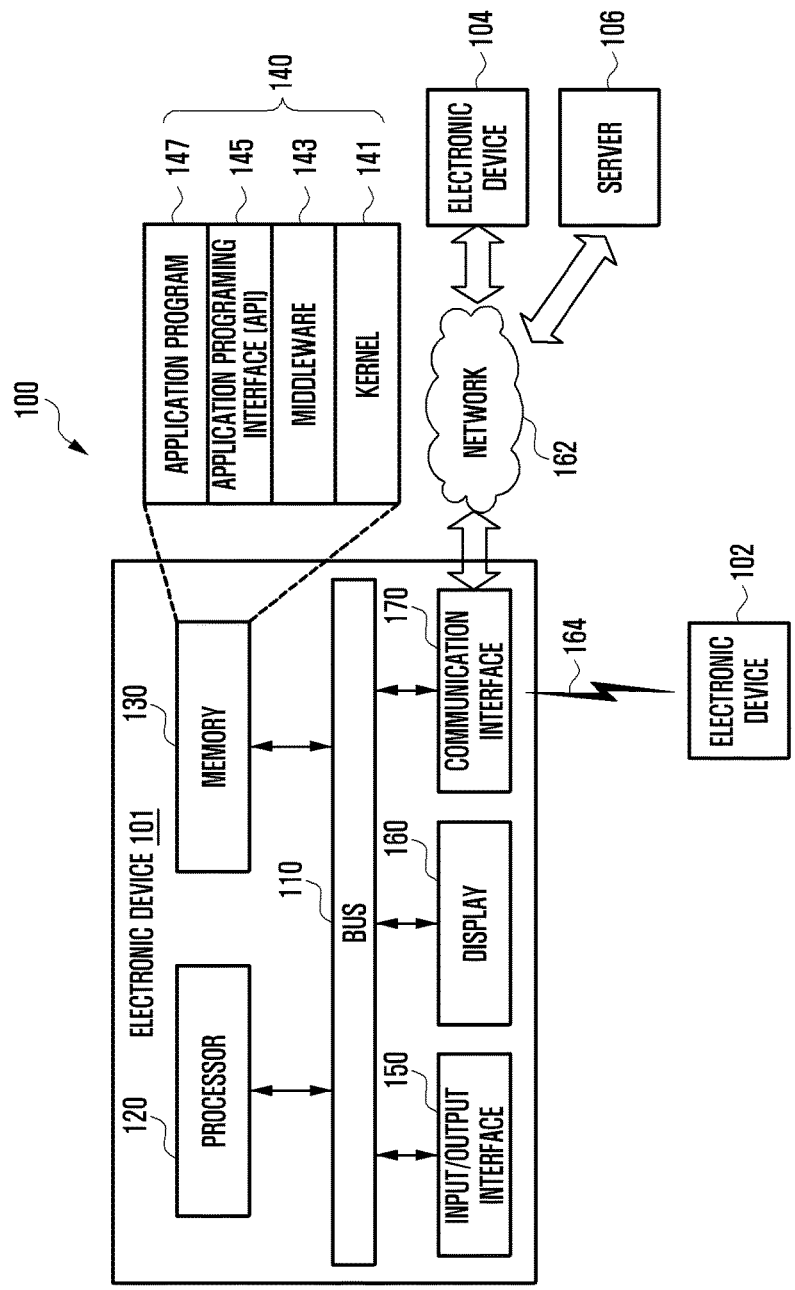
FIG. 1 illustrates electronic devices in a network environment according to various embodiments of the present disclosure.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, exemplary embodiments of the present disclosure are described in detail with reference to the accompanying drawings. While the present disclosure may be embodied in many different forms, specific embodiments of the present disclosure are shown in drawings and are described herein in detail, with the understanding that the present disclosure is to be considered as an exemplification of the principles of the disclosure and is not intended to limit the disclosure to the specific embodiments illustrated. The same reference numbers are used throughout the drawings to refer to the same or like parts.

The expressions "comprising" or "may comprise," as used in the present disclosure indicates presence of a corresponding function, operation, or element and does not limit additional at least one function, operation, or element. Further, in the present disclosure, a term "comprise" or "have" indicates presence of a characteristic, numeral, step, operation, element, component, or combination thereof described in a specification and does not exclude presence or addition of at least one other characteristic, numeral, step, operation, element, component, or combination thereof.

In the present disclosure, an expression "or" includes any combination or the entire combination of together listed words. For example, "A or B" may include A, B, or A and B.

An expression of a first and a second in the present disclosure may represent various elements of the present disclosure, but do not limit corresponding elements. For example, the expression does not limit order and/or importance of corresponding elements. The expression may be used for distinguishing one element from another element. For example, both a first user device and a second user device are user devices and represent different user devices. For example, a first constituent element may be referred to as a second constituent element without deviating from the scope of the present disclosure, and similarly, a second constituent element may be referred to as a first constituent element.

When it is described that an element is "coupled" to another element, the element may be "directly coupled" to the other element or "electrically coupled" to the other element through a third element. However, when it is described that an element is "directly coupled" to another element, no element may exist between the element and the other element.

Terms used in the present disclosure are not to limit the present disclosure but to illustrate exemplary embodiments. When using in a description of the present disclosure and the appended claims, a singular form includes a plurality of forms unless it is explicitly differently represented.

Unless differently defined, entire terms including a technical term and a scientific term used here have the same meaning as a meaning that may be generally understood by a person of common skill in the art. It should be analyzed that generally using terms defined in a dictionary have a meaning corresponding to that of a context of related technology and are not analyzed as an ideal or excessively formal meaning unless explicitly defined.

In this disclosure, an electronic device may be a device that involves a communication function. For example, an electronic device may be a smart phone, a tablet PC (Personal Computer), a mobile phone, a video phone, an e-book reader, a desktop PC, a laptop PC, a netbook computer, a PDA (Personal Digital Assistant), a PMP (Portable Multimedia Player), an MP3 player, a portable medical device, a digital camera, or a wearable device (e.g., an HMD (Head-Mounted Device) such as electronic glasses, electronic clothes, an electronic bracelet, an electronic necklace, an electronic accessory, or a smart watch).

According to some embodiments, an electronic device may be a smart home appliance that involves a communication function. For example, an electronic device may be a TV, a DVD (Digital Video Disk) player, audio equipment, a refrigerator, an air conditioner, a vacuum cleaner, an oven, a microwave, a washing machine, an air cleaner, a set-top box, a TV box (e.g., Samsung HOMESYNC™, APPLE TV™, GOOGLE TV™, etc.), a game console, an electronic dictionary, an electronic key, a camcorder, or an electronic picture frame.

According to some embodiments, an electronic device may be a medical device (e.g., MRA (Magnetic Resonance Angiography), MRI (Magnetic Resonance Imaging), CT (Computed Tomography), ultrasonography, etc.), a navigation device, a GPS (Global Positioning System) receiver, an EDR (Event Data Recorder), an FDR (Flight Data Recorder), a car infotainment device, electronic equipment for ship (e.g., a marine navigation system, a gyrocompass, etc.), avionics, security equipment, or an industrial or home robot.

According to some embodiments, an electronic device may be furniture or part of a building or construction having a communication function, an electronic board, an electronic signature receiving device, a projector, or various measuring instruments (e.g., a water meter, an electric meter, a gas meter, a wave meter, etc.). An electronic device disclosed herein may be one of the above-mentioned devices or any combination thereof. As well understood by those skilled in the art, the above-mentioned electronic devices are exemplary only and not to be considered as a limitation of this disclosure.

FIG. 1 illustrates, in block diagram format, electronic devices in a network environment 100 according to various embodiments of the present disclosure.

Referring to the non-limiting example of FIG. 1, an electronic device 101 may include a bus 110, a processor 120, a memory 130, a user input module 150, a display 160, and a communication interface 170.

The bus 110 may be a circuit for interconnecting elements described above and for allowing a communication, e.g. by transferring a control message, between the elements described above.

The processor 120 can receive commands from the above-mentioned other elements, e.g. the memory 130, the user input module 150, the display 160, and the communication interface 170, through, for example, the bus 110, can decipher the received commands, and perform operations and/or data processing according to the deciphered commands.

The memory 130 can store commands received from the processor 120 and/or other elements, e.g. the user input module 150, the display 160, and the communication interface 170, and/or commands and/or data generated by the processor 120 and/or other elements. The memory 130 may include software and/or programs 140, such as a kernel 141, middleware 143, an Application Programming Interface (API) 145, and an application 147. Each of the programming modules described above may be configured by software, firmware, hardware, and/or combinations of two or more thereof.

The kernel 141 can control and/or manage system resources, e.g. the bus 110, the processor 120 or the memory 130, used for execution of operations and/or functions implemented in other programming modules, such as the middleware 143, the API 145, and/or the application 147. Further, the kernel 141 can provide an interface through which the middleware 143, the API 145, and/or the application 147 can access and then control and/or manage an individual element of the electronic device 101.

The middleware 143 can perform a relay function which allows the API 145 and/or the application 147 to communicate with and exchange data with the kernel 141. Further, in relation to operation requests received from at least one of an application 147, the middleware 143 can perform load balancing in relation to the operation requests by, for example, giving a priority in using a system resource, e.g. the bus 110, the processor 120, and/or the memory 130, of the electronic device 101 to at least one application from among the at least one of the application 147.

The API 145 is an interface through which the application 147 can control a function provided by the kernel 141 and/or the middleware 143, and may include, for example, at least one interface or function for file control, window control, image processing, and/or character control.

The user input module 150 can receive, for example, a command and/or data from a user, and transfer the received command and/or data to the processor 120 and/or the memory 130 through the bus 110. The display 160 can display an image, a video, and/or data to a user.

The communication interface 170 can establish a communication between the electronic device 101 and another electronic devices 102 and 104 and/or a server 106. The communication interface 170 can support short range communication protocols, e.g. a Wireless Fidelity (WiFi) protocol, a BlueTooth (BT) protocol, and a Near Field Communication (NFC) protocol, communication networks, e.g. Internet, Local Area Network (LAN), Wire Area Network (WAN), a telecommunication network, a cellular network, and a satellite network, or a Plain Old Telephone Service (POTS), or any other similar and/or suitable communication networks, such as network 162, or the like. Each of the electronic devices 102 and 104 may be a same type and/or different types of electronic apparatus.

Figure 2:
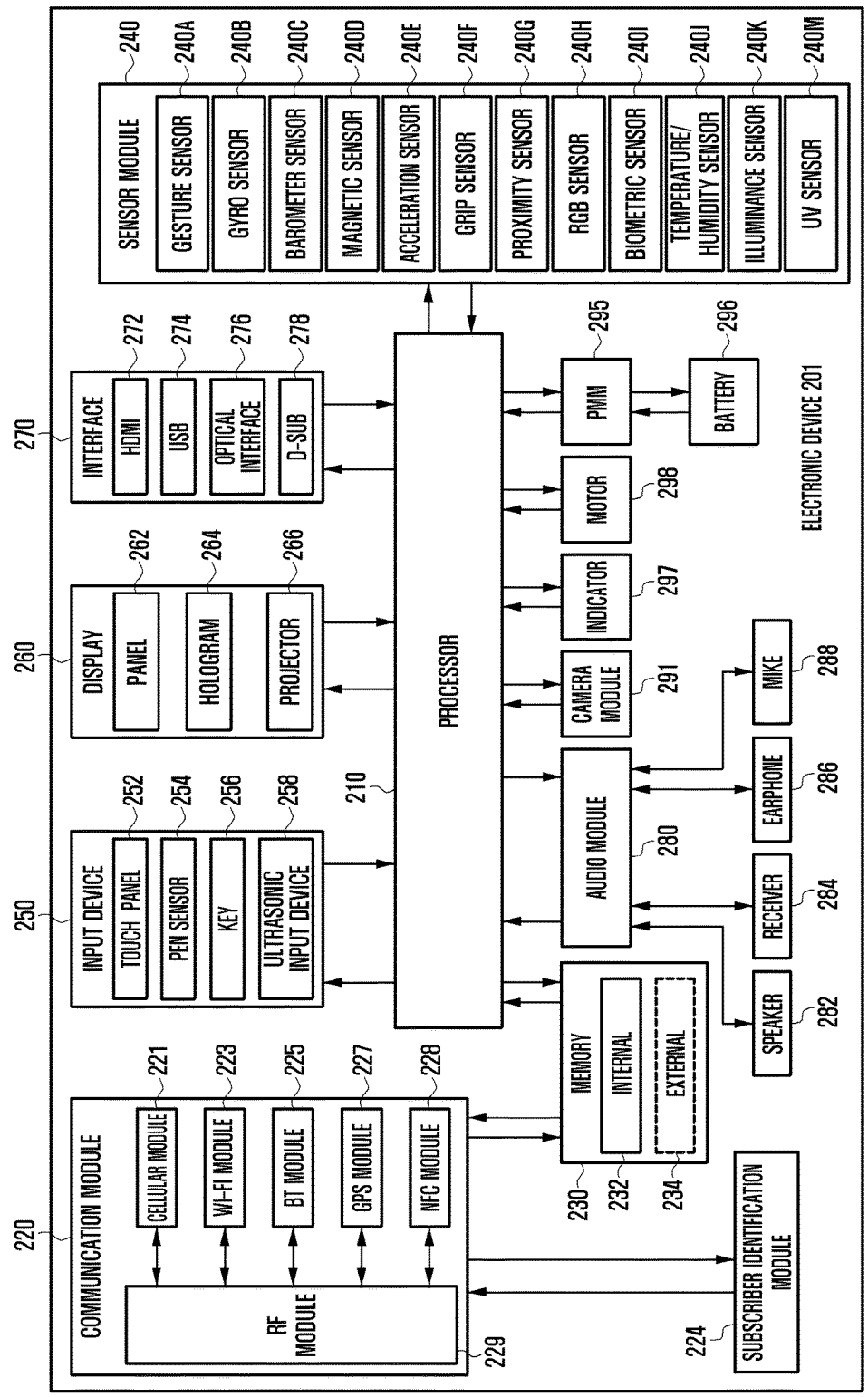
FIG. 2 illustrates, in block diagram format, an electronic device according to various embodiments of the present disclosure.

FIG. 2 illustrates, in block diagram format an electronic device 201 in accordance with some embodiments of the present disclosure. The electronic device 201 may form, for example, the whole or part of the electronic device 201 shown in FIG. 1. Referring to FIG. 2, the electronic device 201 may include at least one processor 210, a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

The processor 210 may drive an operating system or applications, control a plurality of hardware or software components connected thereto, and also perform processing and operation for various data including multimedia data. The processor 210 may be formed as a system-on-chip (SoC), for example. According to some embodiments, the processor 210 may further include a graphic processing unit (GPU) (not shown).

The communication module 220 (e.g., the communication interface 170) may perform a data communication with any other electronic device (e.g., the electronic device 104 or the server 106) connected to the electronic device 200 (e.g., the electronic device 101) through the network. According to some embodiments, the communication module 220 may include therein a cellular module 221, a WiFi module 223, a BT module 225, a GPS module 227, an NFC module 228, and an RF (Radio Frequency) module 229.

The cellular module 221 may offer a voice call, a video call, a message service, an internet service, or the like through a communication network (e.g., LTE, LTE-A, CDMA, WCDMA, UMTS, WiBro, or GSM, etc.). Additionally, the cellular module 221 may perform identification and authentication of the electronic device in the communication network, using the SIM card 224. According to some embodiments, the cellular module 221 may perform at least part of functions the processor 210 can provide. For example, the cellular module 221 may perform at least part of a multimedia control function.

According to some embodiments, the cellular module 221 may include a communication processor (CP). Additionally, the cellular module 221 may be formed of SoC, for example. Although some elements such as the cellular module 221 (e.g., the CP), the memory 230, or the power management module 295 are shown as separate elements being different from the processor 210 in FIG. 3, the processor 210 may be formed to have at least part (e.g., the cellular module 221) of the above elements in some embodiments.

According to some embodiments, the processor 210 or the cellular module 221 (e.g., the CP) may load commands or data, received from a nonvolatile memory connected thereto or from at least one of the other elements, into a volatile memory to process them. Additionally, the processor 210 or the cellular module 221 may store data, received from or created at one or more of the other elements, in the nonvolatile memory.

Each of the WiFi module 223, the BT module 225, the GPS module 227 and the NFC module 228 may include a processor for processing data transmitted or received therethrough. Although FIG. 2 shows the cellular module 221, the WiFi module 223, the BT module 225, the GPS module 227 and the NFC module 228 as different blocks, at least part of them may be contained in a single IC (Integrated Circuit) chip or a single IC package in some embodiments. For example, at least part (e.g., the CP corresponding to the cellular module 221 and a WiFi processor corresponding to the WiFi module 223) of respective processors corresponding to the cellular module 221, the WiFi module 223, the BT module 225, the GPS module 227 and the NFC module 228 may be formed as a single SoC.

Figure 3:
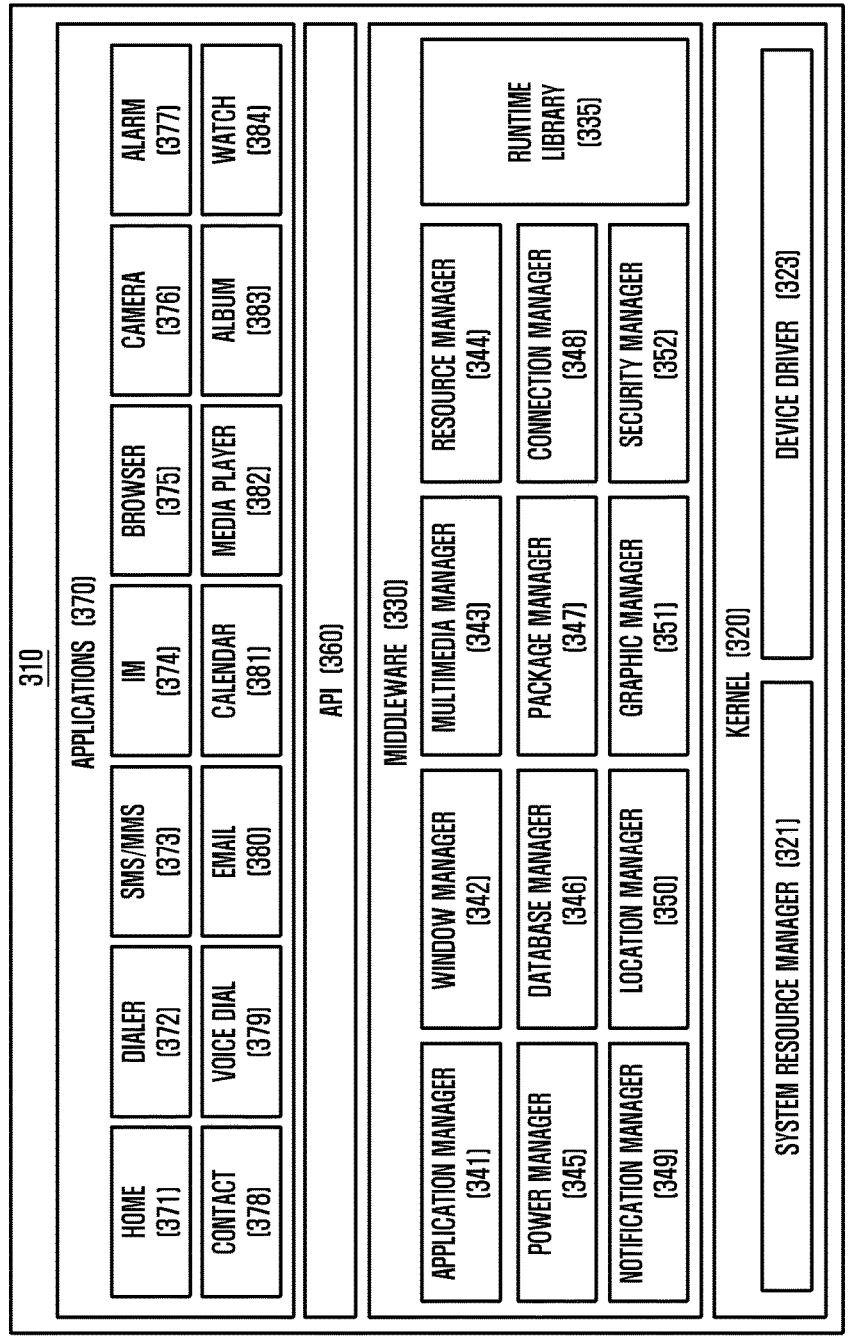
FIG. 3 illustrates, in block diagram format, program modules according to various embodiments of the present disclosure.

The RF module 229 may transmit and receive data, e.g., RF signals or any other electric signals. Although not shown, the RF module 229 may include a transceiver, a PAM (Power Amp Module), a frequency filter, an LNA (Low Noise Amplifier), or the like. Also, the RF module 229 may include any component, e.g., a wire or a conductor, for transmission of electromagnetic waves in a free air space. Although FIG. 3 shows that the cellular module 221, the WiFi module 223, the BT module 225, the GPS module 227 and the NFC module 228 share the RF module 229, at least one of them may perform transmission and reception of RF signals through a separate RF module in some embodiments.

The SIM card 224 may be a specific card formed of SIM and may be inserted into a slot formed at a certain place of the electronic device 201. The SIM card 224 may contain therein an ICCID (Integrated Circuit Card IDentifier) or an IMSI (International Mobile Subscriber Identity).

The memory 230 (e.g., the memory 130) may include an internal memory 232 and an external memory 234. The internal memory 232 may include, for example, at least one of a volatile memory (e.g., DRAM (Dynamic RAM), SRAM (Static RAM), SDRAM (Synchronous DRAM), etc.) or a nonvolatile memory (e.g., OTPROM (One Time Programmable ROM), PROM (Programmable ROM), EPROM (Erasable and Programmable ROM), EEPROM (Electrically Erasable and Programmable ROM), mask ROM, flash ROM, NAND flash memory, NOR flash memory, etc.).

According to some embodiments, the internal memory 232 may have the form of an SSD (Solid State Drive). The external memory 234 may include a flash drive, e.g., CF (Compact Flash), SD (Secure Digital), Micro-SD (Micro Secure Digital), Mini-SD (Mini Secure Digital), xD (eXtreme Digital), memory stick, or the like. The external memory 334 may be functionally connected to the electronic device 201 through various interfaces. According to some embodiments, the electronic device 301 may further include a storage device or medium such as a hard drive.

The sensor module 240 may measure a physical quantity or sense an operating status of the electronic device 201, and then convert measured or sensed information into electric signals. The sensor module 240 may include, for example, at least one of a gesture sensor 240A, a gyro sensor 240B, an atmospheric sensor 240C, a magnetic sensor 240D, an acceleration sensor 240E, a grip sensor 240F, a proximity sensor 240G, a color sensor 240H (e.g., RGB (Red, Green, Blue) sensor), a biometric sensor 240I, a temperature-humidity sensor 240J, an illumination sensor 240K, and a UV (ultraviolet) sensor 240M. Additionally or alternatively, the sensor module 240 may include, e.g., an E-nose sensor (not shown), an EMG (electromyography) sensor (not shown), an EEG (electroencephalogram) sensor (not shown), an ECG (electrocardiogram) sensor (not shown), an IR (infrared) sensor (not shown), an iris scan sensor (not shown), or a finger scan sensor (not shown). Also, the sensor module 240 may include a control circuit for controlling one or more sensors equipped therein.

The input device 250 may include a touch panel 252, a digital pen sensor 254, a key 256, or an ultrasonic input unit 258. The touch panel 252 may recognize a touch input in a manner of capacitive type, resistive type, infrared type, or ultrasonic type. Also, the touch panel 252 may further include a control circuit. In case of a capacitive type, a physical contact or proximity may be recognized. The touch panel 252 may further include a tactile layer. In this case, the touch panel 252 may offer a tactile feedback to a user.

The digital pen sensor 254 may be formed in the same or similar manner as receiving a touch input or by using a separate recognition sheet. The key 256 may include, for example, a physical button, an optical key, or a keypad. The ultrasonic input unit 258 is a specific device capable of identifying data by sensing sound waves with a microphone 288 in the electronic device 201 through an input tool that generates ultrasonic signals, thus allowing wireless recognition. According to some embodiments, the electronic device 201 may receive a user input from any external device (e.g., a computer or a server) connected thereto through the communication module 220.

The display 260 may include a panel 262, a hologram 264, or a projector 266. The panel 262 may be, for example, LCD (Liquid Crystal Display), AM-OLED (Active Matrix Organic Light Emitting Diode), or the like. The panel 262 may have a flexible, transparent or wearable form. The panel 262 may be formed of a single module with the touch panel 252. The hologram 264 may show a stereoscopic image in the air using interference of light. The projector 266 may project an image onto a screen, which may be located at the inside or outside of the electronic device 201. According to some embodiments, the display 260 may further include a control circuit for controlling the panel 262, the hologram 264, and the projector 266.

The interface 270 may include, for example, an HDMI (High-Definition Multimedia Interface) 272, a USB (Universal Serial Bus) 274, an optical interface 276, or a D-sub (D-subminiature) 278. The interface 270 may be contained, for example, in the communication interface 170 shown in FIG. 1. Additionally or alternatively, the interface 270 may include, for example, an MHL (Mobile High-definition Link) interface, an SD (Secure Digital) card/MMC (MultiMedia Card) interface, or an IrDA (Infrared Data Association) interface.

The audio module 280 may perform a conversion between sounds and electric signals. The audio module 280 may process sound information inputted or outputted through a speaker 282, a receiver 284, an earphone 286, or a microphone 288.

The camera module 291 is a device capable of obtaining still images and moving images. According to some embodiments, the camera module 291 may include at least one image sensor (e.g., a front sensor or a rear sensor), a lens (not shown), an ISP (Image Signal Processor, not shown), or a flash (e.g., LED or xenon lamp, not shown).

The power management module 295 may manage electric power of the electronic device 201. Although not shown, the power management module 295 may include, for example, a PMIC (Power Management Integrated Circuit), a charger IC, or a battery or fuel gauge.

The PMIC may be formed, for example, of an IC chip or SoC. Charging may be performed in a wired or wireless manner. The charger IC may charge a battery 296 and prevent overvoltage or overcurrent from a charger. According to some embodiments, the charger IC may have a charger IC used for at least one of wired and wireless charging types. A wireless charging type may include, for example, a magnetic resonance type, a magnetic induction type, or an electromagnetic type. Any additional circuit for a wireless charging may be further used such as a coil loop, a resonance circuit, or a rectifier.

The battery gauge may measure the residual amount of the battery 296 and a voltage, current or temperature in a charging process. The battery 296 may store or create electric power therein and supply electric power to the electronic device 201. The battery 296 may be, for example, a rechargeable battery or a solar battery.

The indicator 297 may show thereon a current status (e.g., a booting status, a message status, or a recharging status) of the electronic device 201 or of its part (e.g., the processor 210). The motor 298 may convert an electric signal into a mechanical vibration. Although not shown, the electronic device 301 may include a specific processor (e.g., GPU) for supporting a mobile TV. This processor may process media data that comply with standards of DMB (Digital Multimedia Broadcasting), DVB (Digital Video Broadcasting), or media flow.

Each of the above-discussed elements of the electronic device disclosed herein may be formed of one or more components, and its name may vary according to the type of the electronic device. The electronic device disclosed herein may be formed of at least one of the above-discussed elements without some elements or with additional other elements. Some of the elements may be integrated into a single entity that still performs the same functions as those of such elements before integrated.

The term "module" used in this disclosure may refer to a certain unit that includes one of hardware, software and firmware or any combination thereof. The module may be interchangeably used with unit, logic, logical block, component, or circuit, for example. The module may be the minimum unit, or part thereof, which performs one or more particular functions. The module may be formed mechanically or electronically. For example, the module disclosed herein may include at least one of ASIC (Application-Specific Integrated Circuit) chip, FPGAs (Field-Programmable Gate Arrays), and programmable-logic device, which have been known or are to be developed.

FIG. 3 illustrates, in block diagram format, a configuration of a programming module 310 according to some embodiments of the present disclosure.

Referring to the non-limiting example of FIG. 3, the programming module 310 may be included (or stored) in the electronic device 301 (e.g., the memory 230) illustrated in FIG. 1 or may be included (or stored) in the electronic device 201 (e.g., the memory 230) illustrated in FIG. 2. At least a part of the programming module 310 may be implemented in software, firmware, hardware, or a combination of two or more thereof. The programming module 310 may be implemented in hardware, and may include an OS controlling resources related to an electronic device (e.g., the electronic device 101 or 201) and/or various applications (e.g., an application 370) executed in the OS. For example, the OS may be Android, iOS, Windows, Symbian, Tizen, Bada, and the like.

Referring to FIG. 3, the programming module 310 may include a kernel 320, a middleware 330, an API 360, and/or the application 370.

The kernel 320 (e.g., the kernel 211) may include a system resource manager 321 and/or a device driver 323. The system resource manager 321 may include, for example, a process manager (not illustrated), a memory manager (not illustrated), and a file system manager (not illustrated). The system resource manager 321 may perform the control, allocation, recovery, and/or the like of system resources. The device driver 323 may include, for example, a display driver (not illustrated), a camera driver (not illustrated), a Bluetooth driver (not illustrated), a shared memory driver (not illustrated), a USB driver (not illustrated), a keypad driver (not illustrated), a Wi-Fi driver (not illustrated), and/or an audio driver (not illustrated). Also, according to some embodiments of the present disclosure, the device driver 323 may include an Inter-Process Communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to some embodiments of the present disclosure, the runtime library 435 may perform functions which are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a Basic Input/Output System (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to some embodiments of the present disclosure, when the electronic device (e.g., the electronic device 101) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 460 (e.g., the API 145) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 147) may include, for example, a preloaded application and/or a third party application. The applications 370 (e.g., the applications 147) may include, for example, a home application 371, a dialer application 372, a Short Message Service (SMS)/Multimedia Message Service (MMS) application 373, an Instant Message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 310 may be implemented by instructions stored in a non-transitory computer-readable storage medium. When the instructions are executed by one or more processors (e.g., the processor 210), the one or more processors may perform functions corresponding to the instructions. The non-transitory computer-readable storage medium may be, for example, the memory 230. At least a part of the programming module 310 may be implemented (e.g., executed) by, for example, the one or more processors. At least a part of the programming module 310 may include, for example, a module, a program, a routine, a set of instructions, and/or a process for performing one or more functions.

According to various embodiments of the present disclosure, the electronic device may include a processor. The processor may be configured to: examine the sound level of an audio signal obtained from an external object for a preset time; change, if the frequency with which the sound level becomes higher than or equal to a specified level satisfies a preset condition, a reference level, at which the gain value for audio signal amplification is changed in accordance with the amplitude change of the audio signal, for at least one section of the audio signal satisfying the preset condition; and amplify the at least one section of the audio signal according to the changed reference level.

In at least one embodiment, the second specified gain may be set to be smaller than the first specified gain.

In at least one embodiment, the processor may be configured to determine the second specified gain according to the changed reference level.

In at least one embodiment, the processor may be configured to filter the audio signal into a first frequency band signal and a second frequency band signal by using a filter, and perform the above operations of examining, changing, and amplifying for each of the first frequency band signal and the second frequency band signal.

In at least one embodiment, the processor may be configured to mix the amplified first frequency band signal and the amplified second frequency band signal together to generate an amplified audio signal of the overall frequency band.

In at least one embodiment, the processor may be configured to compare the energy distribution of at least one section of the obtained audio signal with the energy distribution of at least one section of the amplified audio signal corresponding to the at least one section of the obtained audio signal, and change at least one of the reference level, the first specified gain, and the second specified gain at least on the basis of the comparison result.

In at least one embodiment, the processor may be configured to identify the sound level of at least one section of the amplified audio signal, and post-process the amplified audio signal according to the identified sound level.

In at least one embodiment, the processor may be configured to change the first specified gain or the second specified gain according to an audio-related function being executed in the electronic device.

According to various embodiments of the present disclosure, the electronic device may include a processor. The processor may be configured to: examine the sound level of an audio signal obtained from an external object for a preset time; amplify, if the examined sound level meets a first specified level, the section of the audio signal whose sound level corresponds to the first specified level at a first specified gain; and change, if the examined sound level meets a second specified level, a reference level for the transition from the first specified gain to a second specified gain less than the first specified gain for the section of the audio signal where the sound level corresponds to the second specified level, and amplify at least a portion of the audio signal that meets the changed reference level of the section corresponding to the second specified level at the second specified gain.

In at least one embodiment, the processor may be configured to determine the second specified gain according to the changed reference level.

In at least one embodiment, the processor may be configured to: filter the audio signal into a first frequency band signal and a second frequency band signal by using a filter; perform the above operations of examining, amplifying at the first specified gain, and changing and amplifying at the second specified gain for each of the first frequency band signal and the second frequency band signal; and mix the amplified first frequency band signal and the amplified second frequency band signal together to generate an amplified audio signal of the overall frequency band.

In at least one embodiment, the processor may be configured to examine the energy distribution of the amplified audio signal, and change at least one of the reference level, the first specified gain, and the second specified gain on the basis of the examined energy distribution.

Figure 4A:
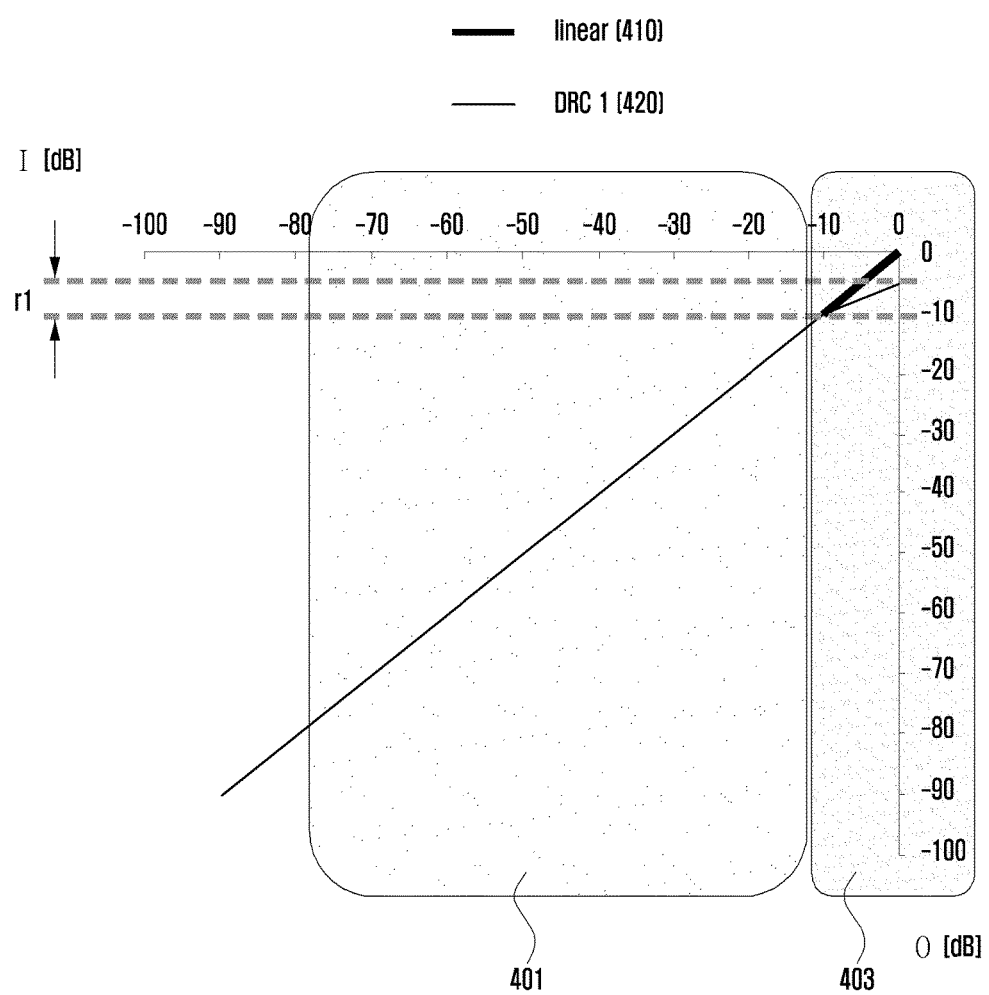
FIGS. 4A and 4B illustrate operations of a method for audio signal processing in an electronic device according to some embodiments of the present disclosure.
Figure 4B:
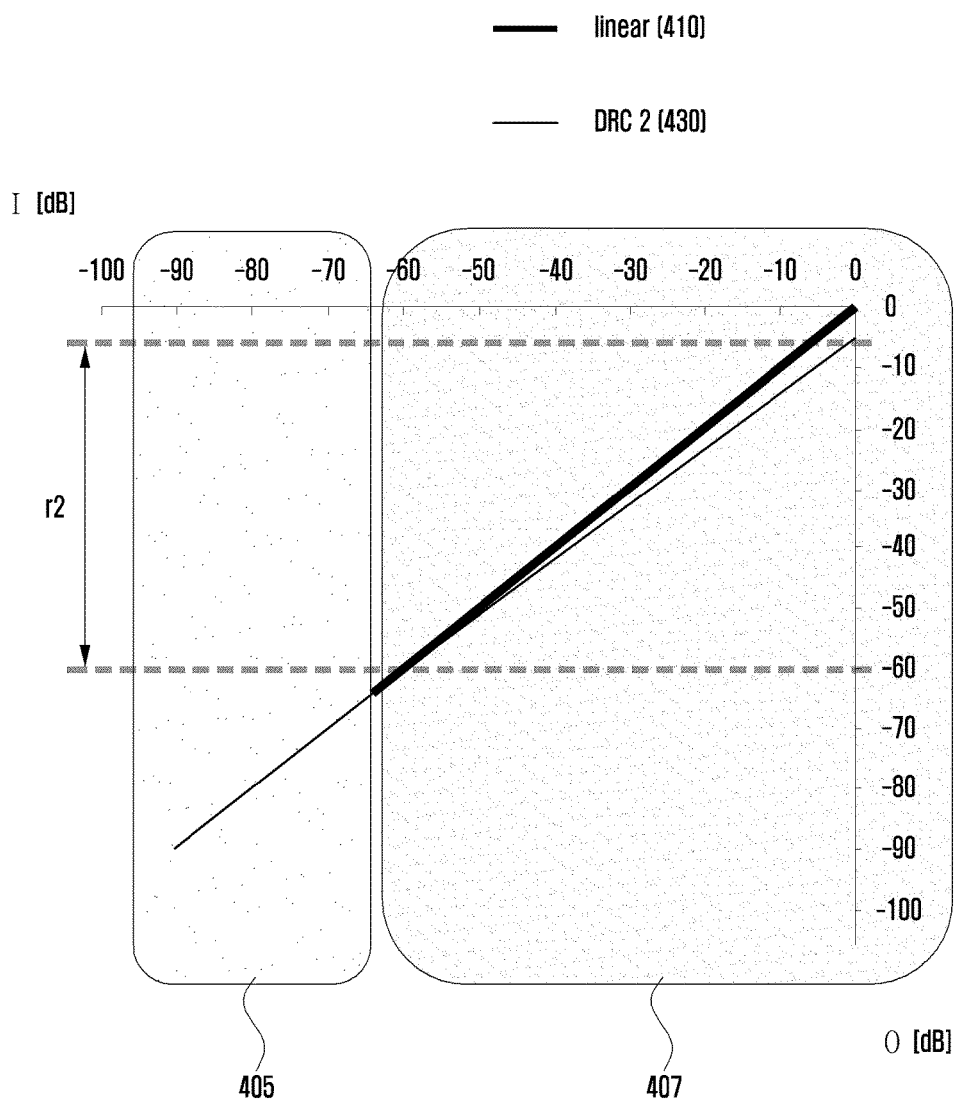

FIGS. 4A and 4B illustrate operations of a method of audio signal processing in an electronic device according to some embodiments of the present disclosure. FIGS. 4A and 4B illustrate a non-limiting example of amplifying an audio signal according to a specified gain.

In some embodiments, the electronic device may amplify an audio signal at a specified gain to prevent clipping of the audio signal. For example, the specified gain may be less than or equal to 1, and the electronic device may compress the audio signal. The electronic device can amplify the audio signal by applying different gains to one section of the audio signal where the signal level is greater than or equal to a reference level and another section of the audio signal where the signal level is less than the reference level.

For example, the electronic device may maintain the audio signal as it is in a section where the amplitude of the sound of the audio signal is less than the reference level (or amplifies it with a gain of 1), and may compress the audio signal according to a specified gain in a section where the amplitude of the sound of the audio signal is greater than or equal to the reference level.

In FIG. 4A, reference numeral 410 indicates a reference graph, which shows linearity (i.e., no amplification). Reference numeral 420 indicates a case where the audio signal is amplified at a specified gain when the reference level is −15 dB. That is, reference numeral 420 indicates an example of compressing the audio signal through dynamic range control (DRC) according to the reference level of −15 dB.

In FIG. 4A, reference numeral 401 indicates a region where the audio signal is preserved without compression, and reference numeral 403 indicates a region where the audio signal is compressed by applying a given gain. That is, r1 indicates an output region for the compressed audio signal when the audio signal is amplified (compressed) at a specified gain. For example, the electronic device can compress the audio signal according to the slope (i.e., gain) of the graph 420 if the amplitude of the sound of the audio signal is greater than or equal to a specified reference level (e.g., −15 dB).

In FIG. 4B, reference numeral 410 indicates a reference graph, showing a linear case (i.e., no amplification). Reference numeral 430 indicates a case where the audio signal is amplified at a specified gain when the reference level is −70 dB. For example, reference numeral 405 indicates a region where the audio signal is preserved without compression, and reference numeral 407 indicates a region where the audio signal is compressed by applying a given gain. That is, r2 indicates an output region for the compressed audio signal when the audio signal is amplified (compressed) at a specified gain. For example, the electronic device can compress the audio signal according to the slope (i.e., gain) of the graph 430 if the amplitude of the sound of the audio signal is greater than or equal to a specified reference level (e.g., −70 dB).

As shown in FIGS. 4A and 4B, the output region (r1 or r2) of the audio signal may be changed according to the specified reference level, and the gain for compressing the audio signal may be changed according to the specified reference level. For example, when the audio signal is amplified (compressed) according to a relatively high reference level as in the case of FIG. 4A, the section 401 where the original sound is preserved increases while the audio signal can be compressed more compared with the original sound in the compression section 403. That is, in the compression section, the amplitude of the sound of the audio signal can be excessively compressed unlike the original sound irrespective of the level. For example, when the audio signal is amplified (compressed) according to a relatively low reference level as in the case of FIG. 4B, the section 405 where the original sound is preserved decreases while the level of the sound can be maintained in a similar form to the original sound in the compression section 407.

In various embodiments, the electronic device can change the reference level according to the state of the obtained audio signal (or the environment outside the electronic device). For example, the reference level can be changed from the case of FIG. 4A to the case of FIG. 4B. In this case, according to the change of the reference level, the specified gain can also be changed from the slope of the graph 410 of FIG. 4A to the slope of the graph 430 of FIG. 4B.

FIG. 5 illustrates results of audio signal processing.

In FIG. 5, reference numeral 510 indicates the original audio signal, reference numeral 520 indicates a case where the audio signal is compressed according to a relatively high reference level (e.g., about −15 dB), and reference numeral 530 indicates a case where the audio signal is compressed according to a relatively low reference level (e.g., about −70 dB). Here, reference numeral 520 denotes a case where the audio signal is amplified according to the graph 420 of FIG. 4A, and reference numeral 530 denotes a case where the audio signal is amplified according to the graph 430 of FIG. 4B.

The sound of the original audio signal can have large and small levels. For example, in the case indicated by indicia 520, since the audio signal is compressed according to a relatively high reference level, the form of the original audio signal can be maintained in the section 523 where the volume of the audio signal is small, but the form of the original audio signal can be altered in the section 521 where the volume of the audio signal is large because the audio signal is compressed at a constant ratio without change of level. That is, in the section 521 where the volume of the audio signal is large, the signal may be squashed (sound squashing).

For example, in the case indicated by indicia 530, since the audio signal is compressed according to a relatively low reference level, the form of the original audio signal can be maintained in the section 531 where the volume of the audio signal is large, but the audio signal can be unnecessarily compressed in the section 533 where the volume of the audio signal is small. That is, even in the section 533 where the volume of the audio signal is small, the audio signal can be compressed to such an extent that the amplitude of the original audio signal is not maintained.

For example, when the reference level is maintained at a specific value, the electronic device can amplify the audio signal according to the same gain regardless of the state (e.g., energy distribution) of the obtained audio signal or the surrounding environment. When the section where the volume of the audio signal is large and the section where the volume of the audio signal is small are properly mixed, or there is only a section where the volume of the audio signal is large, if the audio signal is compressed according to the same reference level, the original sound may be not maintained, or the audio signal may be compressed in a form different from the original sound without amplitude variation. Accordingly, in the audio signal processing method and the electronic device according to various embodiments of the present disclosure, the reference level is adaptively changed according to the state (e.g., energy distribution) of the obtained audio signal, so that the audio signal can be amplified (compressed) appropriately according to the signal characteristics or the surrounding environment. Hence, it is possible to provide high-quality audio to the user.

Figure 6:
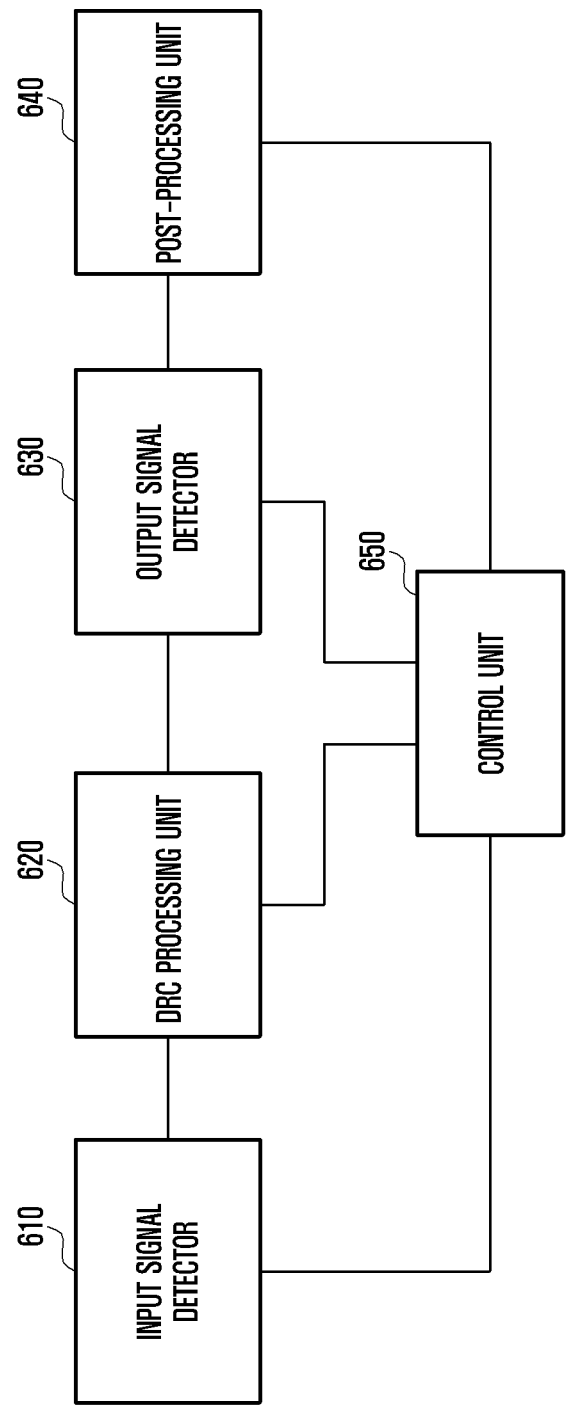
FIG. 6 illustrates, in block diagram format, an electronic device according to various embodiments of the present disclosure.

FIG. 6 illustrates, in block diagram format, an electronic device according to some embodiments of the present disclosure.

In some embodiments, the input signal detector 610 can check the sound level of an audio signal obtained from an external object for a preset time. For example, the electronic device can pick up an audio signal from an external object using a microphone. The input signal detector 610 can check the sound level of the audio signal for a preset time under the control of the control unit 650. Here, the preset time can be specified differently according to the settings of the user or electronic device. The input signal detector 610 can check the level of the sound for at least a part of the obtained audio signal. For example, the input signal detector 610 may examine the waveform (e.g., amplitude) of the audio signal.

In at least one embodiment, the input signal detector 610 can check the frequency with which the sound level of the audio signal becomes higher than or equal to a specified level. Here, the specified level may be set to the threshold for acceptable amplitudes in audio-related components (e.g., microphone) of the electronic device. The specified level may be set to the threshold (e.g., saturation value for the amplitude of the audio signal) at which the audio signal may be not clipped. The specified level can be set differently according to the settings of the user or electronic device.

In certain embodiments, the input signal detector 610 can check the state of the sound of the audio signal (e.g., energy distribution). The input signal detector 610 can check the sound level of the audio signal in a specific interval. The input signal detector 610 can check the sound level of the audio signal in a specified range. The input signal detector 610 can check the ratio between the sections where the volume of the audio signal is large, is medium, and is small. The input signal detector 610 can identify the distribution of sound levels of the audio signal.

Then, the input signal detector 610 can transfer information about the examined audio signal to the control unit 650.

In various embodiments, the DRC processing unit 620 may amplify the audio signal according to the reference level under the control of the control unit 650. For example, the DRC processing unit 620 can amplify the audio signal at a specified gain. The DRC processing unit 620 can amplify the audio signal at different gains depending on whether the sound level of the audio signal is above or below the reference level. For example, the DRC processing unit 620 may amplify the audio signal at a first specified gain when the amplitude of the audio signal is less than the reference level, and may amplify the audio signal at a second specified gain when the amplitude of the audio signal is greater than or equal to the reference level. Here, the second specified gain may be set smaller than the first specified gain, and the first specified gain may be one. The DRC processing unit 620 may output the original audio signal as it is when the signal amplitude is lower than the reference level, and may compress the audio signal according to the specified gain when the signal amplitude is higher than or equal to the reference level.

In certain embodiments, the reference level may be changed under the control of the control unit 650. For example, the DRC processing unit 620 can amplify the audio signal at a specified gain (i.e., compress the audio signal) according to the reference level changed by the control unit 650. In one embodiment, the specified gain (e.g., first specified gain or second specified gain) may be changed under the control of the control unit 650. For example, the DRC processing unit 620 can amplify the audio signal according to the first specified gain or second specified gain changed by the control unit 650.

In at least one embodiment, the output signal detector 630 can check the amplitude of the amplified audio signal at a specified time. For example, the output signal detector 630 can check the sound level of the amplified audio signal for a preset time under the control of the control unit 650. The preset time can be specified differently according to the settings of the user or the electronic device. The output signal detector 630 may check the sound level of the amplified audio signal over at least a section. For example, the output signal detector 630 can examine the waveform (e.g., amplitude) of the amplified audio signal.

In various embodiments, the output signal detector 630 can check the sound state of the amplified audio signal (e.g., energy distribution). The output signal detector 630 can examine the sound level of the amplified audio signal in a section corresponding to the section where the input signal detector 610 has examined the sound level of the audio signal. The output signal detector 630 can examine the sound level of the amplified audio signal when the amplitude of the audio signal is within a specified range. The output signal detector 630 can check the ratio between the sections where the volume of the amplified audio signal is large, is medium, and is small. The output signal detector 630 can identify the distribution of sound levels of the amplified audio signal.

Then, the output signal detector 630 can transfer information about the examined audio signal to the control unit 650.

In certain embodiments, the post-processing unit 640 may post-process the amplified audio signal under the control of the control unit 650. The post-processing unit 640 may include a filter or an amplifier. The post-processing unit 640 may equalize the amplified audio signal. The post-processing unit 640 may improve the sound quality of the audio signal by post-processing the amplified audio signal according to the reference level or the gain applied to the audio signal (e.g., first specified gain or second specified gain). The parameter of the equalization filter or the gain of the amplifier included in the post-processing unit 640 may be changed under the control of the control unit 650.

In at least one embodiment, the control unit 650 may control operations of the input signal detector 610, DRC processing unit 620, output signal detector 630, and post-processing unit 640. The control unit 650 may be the processor 210 shown in FIG. 2.

In various embodiments, the control unit 650 may receive information on the original audio signal or the amplified audio signal from the input signal detector 610 or the output signal detector 630. For example, the control unit 650 may receive, from the input signal detector 610, information related to the state of the original audio signal (e.g., distribution of sound levels in the original audio signal) or the frequency with which the sound level of the original audio signal becomes higher than or equal to the specified level. The control unit 650 may receive information related to the state of the amplified audio signal (e.g., distribution of sound levels in the amplified audio signal) from the output signal detector 630. The control unit 650 may receive information about the distribution of sound levels in a given section of the original audio signal or the amplified audio signal from the input signal detector 610 or the output signal detector 630.

In some embodiments, if the frequency with which the sound level of the original audio signal becomes higher than or equal to the specified level satisfies a preset condition, the control unit 650 may change the reference level for the transition from the first specified gain to the second specified gain in the section where the amplitude of the audio signal corresponds to the specified level. Here, the preset condition can be satisfied when the above frequency is greater than or equal to a preset value. The reference level may be used to apply different gains depending on the amplitude of the audio signal. That is, the control unit 650 can change the degree to which the DRC processing unit 620 amplifies (compresses) the audio signal by changing the reference level.

In at least one embodiment, the control unit 650 may compare the amplitude distribution (energy distribution) in a section of the original audio signal with the amplitude distribution (energy distribution) in the corresponding section of the amplified audio signal. That is, the control unit 650 may compare the amplitude distribution of the amplified audio signal with the amplitude distribution of the original audio signal to determine the degree to which the audio signal is compressed. Upon determining that the degree to which the amplified audio signal is compressed with respect to the original audio signal is above a given level, the control unit 650 may change the reference level or the specified gain (e.g., first specified gain or second specified gain).

In various embodiments, if most of the amplified audio signal is within a given range of amplitude, the control unit 650 may determine that the sound is flattened without amplitude variation and the sound quality is deteriorated, and may change the reference level or the specified gain (e.g., first specified gain or second specified gain). That is, if most of the amplified audio signal is within a given range of amplitude, the control unit 650 may determine that the audio signal is excessively compressed and may change the reference level or the specified gain. The control unit 650 can change the second specified gain according to the changed reference level.

In certain embodiments, the control unit 650 may change the specified gain (e.g., first specified gain or second specified gain) according to the audio-related function being executed in the electronic device. For example, the control unit 650 may change the specified gain according to the executed function such as the call function, audio recording function, or video recording function.

In at least one embodiment, the control unit 650 can control the DRC processing unit 620 to amplify the section of the audio signal corresponding to the reference level at the second specified gain.

In at least one embodiment, when the sound level of the original audio signal reaches a first specified level, the control unit 650 can control the DRC processing unit 620 to amplify the section of the audio signal corresponding to the first specified level at the first specified gain. In certain embodiments, when the sound level of the original audio signal reaches a second specified level, the control unit 650 may change the reference level for the transition from the first specified gain to the second specified gain less than the first specified gain in the section corresponding to the second specified level. The control unit 650 can control the DRC processing unit 620 to amplify the section of the audio signal corresponding to the second specified level at the second specified gain.

In various embodiments, at least some of the input signal detector 610, the DRC processing unit 620, the output signal detector 630, the post-processing unit 640, and the control unit 650 may be implemented as one integrated module (e.g., processor 210 of FIG. 2). That is, the processor 210 shown in FIG. 2 may execute at least some or all of the operations of the input signal detector 610, the DRC processing unit 620, the output signal detector 630, the post-processing unit 640, and the control unit 650.

In at least one embodiment, one or more of the components of the electronic device shown in FIG. 6 may be omitted. For example, the electronic device may not include the output signal detector 630 or the post-processing unit 640.

Figure 7:
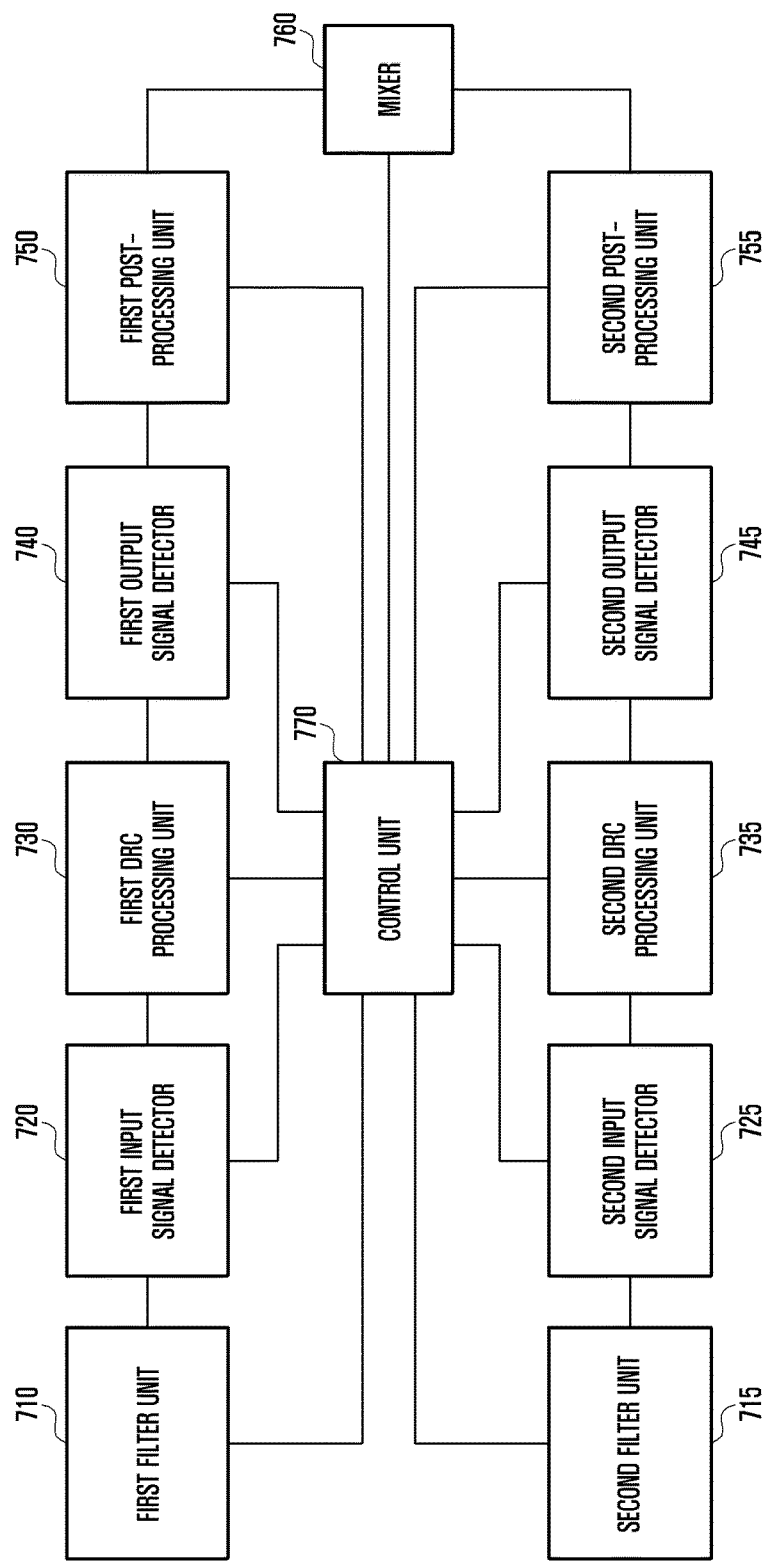
FIG. 7 illustrates, in block diagram format, an electronic device according to certain embodiments of the present disclosure.

FIG. 7 illustrates, in block diagram format, an electronic device according to some embodiments of the present disclosure. In the following description of the non-limiting example of FIG. 7, the parts overlapping with those of FIG. 6 will be briefly described.

In at least one embodiment, the first filter unit 710 may filter an audio signal obtained from an external object into a signal of a first frequency band. For example, the first filter unit 710 may include a low-pass filter. The first frequency band may be a low frequency band.

In certain embodiments, the second filter unit 715 may filter an audio signal obtained from an external object into a signal of a second frequency band. For example, the second filter unit 715 may include a high-pass filter. The second frequency band may be a high frequency band.

In at least one embodiment, the first input signal detector 720 can check the sound level of the first frequency band signal for a preset time. The first input signal detector 720 can check the sound level for at least a part of the first frequency band signal. For example, the first input signal detector 720 may examine the waveform (e.g., amplitude) of the first frequency band signal.

In some embodiments, the first input signal detector 720 can check the frequency with which the sound level of the first frequency band signal becomes higher than or equal to a specified level. Here, the specified level may be set to the threshold at which the first frequency band signal may be not clipped (e.g., saturation value for the amplitude of the first frequency band signal).

In various embodiments, the first input signal detector 720 can check the state of the sound of the first frequency band signal (e.g., energy distribution). The first input signal detector 720 can check the sound level of the first frequency band signal in a specific interval.

Then, the first input signal detector 720 can transfer information about the examined first frequency band signal to the control unit 770.

In at least one embodiment, the second input signal detector 725 can check the sound level of the second frequency band signal for a preset time. The second input signal detector 725 can check the sound level for at least a part of the second frequency band signal. The second input signal detector 725 can check the frequency with which the sound level of the second frequency band signal becomes higher than or equal to a specified level. The second input signal detector 725 can check the state of the sound of the second frequency band signal (e.g., energy distribution). The second input signal detector 725 can check the sound level of the second frequency band signal in a specific interval.

Then, the second input signal detector 725 can transfer information about the examined second frequency band signal to the control unit 770.

In certain embodiments, the first DRC processing unit 730 may amplify the first frequency band signal according to the first reference level under the control of the control unit 770. For example, the first DRC processing unit 730 can amplify the first frequency band signal at a specified gain. The first DRC processing unit 730 can amplify the first frequency band signal at different gains depending on whether the sound level of the first frequency band signal is above or below the first reference level. For example, the first DRC processing unit 730 may amplify the first frequency band signal at a first specified gain when the amplitude of the first frequency band signal is less than the first reference level, and may amplify the first frequency band signal at a second specified gain when the amplitude of the first frequency band signal is greater than or equal to the first reference level. Here, the second specified gain may be set smaller than the first specified gain. The first DRC processing unit 730 may output the original first frequency band signal as it is when the signal amplitude is lower than the first reference level, and may compress the first frequency band signal according to the specified gain (e.g., second specified gain) when the signal amplitude is higher than or equal to the first reference level.

For example, the first DRC processing unit 730 can amplify the audio signal at a specified gain (i.e., compress the audio signal) according to the first reference level changed by the control unit 770.

In at least one embodiment, the second DRC processing unit 735 may amplify the second frequency band signal according to the second reference level under the control of the control unit 770. For example, the second DRC processing unit 735 can amplify the second frequency band signal at a specified gain. The second DRC processing unit 735 can amplify the second frequency band signal at different gains depending on whether the sound level of the second frequency band signal is above or below the second reference level. For example, the second DRC processing unit 735 may amplify the second frequency band signal at a first specified gain when the amplitude of the second frequency band signal is less than the second reference level, and may amplify the second frequency band signal at a third specified gain when the amplitude of the second frequency band signal is greater than or equal to the second reference level. Here, the third specified gain may be set smaller than the first specified gain. The second DRC processing unit 735 may output the original second frequency band signal as it is when the signal amplitude is lower than the second reference level, and may compress the second frequency band signal according to the specified gain (e.g., third specified gain) when the signal amplitude is higher than or equal to the second reference level. The second DRC processing unit 735 may amplify the second frequency band signal according to a fourth specified gain different from the first specified gain when the signal amplitude is lower than the second reference level.

For example, the second DRC processing unit 735 can amplify the audio signal at a specified gain (i.e., compress the audio signal) according to the second reference level changed by the control unit 770.

In various embodiments, the first output signal detector 740 can check the amplitude of the amplified first frequency band signal at a specified time. For example, the first output signal detector 740 can check the sound level of the amplified first frequency band signal over at least a section. For example, the first output signal detector 740 can examine the waveform (e.g., amplitude) of the amplified first frequency band signal.

In some embodiments, the first output signal detector 740 can check the sound state of the first frequency band signal (e.g., energy distribution). The first output signal detector 740 can examine the sound level of the amplified first frequency band signal in a section corresponding to the section where the first input signal detector 720 has examined the sound level of the audio signal.

Then, the first output signal detector 740 can transfer information about the examined first frequency band signal to the control unit 770.

In at least one embodiment, the second output signal detector 745 can check the amplitude of the amplified second frequency band signal at a specified time. For example, the second output signal detector 745 can check the sound level of the amplified second frequency band signal over at least a section. For example, the second output signal detector 745 can examine the waveform (e.g., amplitude) of the amplified second frequency band signal.

In some embodiments, the second output signal detector 745 can check the sound state of the amplified second frequency band signal (e.g., energy distribution). The second output signal detector 745 can examine the sound level of the amplified second frequency band signal in a section corresponding to the section where the second input signal detector 725 has examined the sound level of the audio signal.

Then, the second output signal detector 745 can transfer information about the examined second frequency band signal to the control unit 770.

In certain embodiments, the first post-processing unit 750 may post-process the amplified first frequency band signal under the control of the control unit 770. For example, the first post-processing unit 750 may equalize the amplified first frequency band signal. The first post-processing unit 750 may post-process the amplified first frequency band signal according to the first reference level or the gain applied to the first frequency band signal.

In various embodiments, the second post-processing unit 755 may post-process the amplified second frequency band signal under the control of the control unit 770. For example, the second post-processing unit 755 may equalize the amplified second frequency band signal. The second post-processing unit 755 may post-process the amplified second frequency band signal according to the second reference level or the gain applied to the second frequency band signal.

In at least one embodiment, the mixer 760 may mix the amplified signal of the first frequency band and the amplified signal of the second frequency band to generate an amplified audio signal of the overall frequency band under the control of the control unit 770.

In at least one embodiment, the control unit 770 may control the operations of the first filter unit 710, the second filter unit 715, the first input signal detector 720, the second input signal detector 725, the first DRC processing unit 730, the second DRC processing unit 735, the first output signal detector 740, the second output signal detector 745, the first post-processing unit 750, the second post-processing unit 755, and the mixer 760. The control unit 770 may be the processor 210 shown in FIG. 2.

In certain embodiments, the control unit 770 may receive information on the state of the original audio signal of the first frequency band or the second frequency band from the first input signal detector 720 or the second input signal detector 725, or receive information on the frequency with which the sound level of the original audio signal of the first frequency band or the second frequency band becomes higher than or equal to the specified level. The control unit 770 may receive information on the state of the amplified signal of the first frequency band or the second frequency band from the first output signal detector 740 or the second output signal detector 745. The control unit 770 may receive information about the distribution of sound levels in a given section of the original signal of the first frequency band or the second frequency band from the first input signal detector 720 or the second input signal detector 725, and may receive information about the distribution of sound levels in a given section of the amplified signal of the first frequency band or the second frequency band from the first output signal detector 740 or the second output signal detector 745.

In various embodiments, if the frequency with which the sound level of the first frequency band signal becomes higher than or equal to the specified level satisfies a preset condition, the control unit 770 may change the first reference level for the transition from the first specified gain to the second specified gain in the section where the amplitude of the first frequency band signal corresponds to the specified level. If the frequency with which the sound level of the second frequency band signal becomes higher than or equal to the specified level satisfies a preset condition, the control unit 770 may change the second reference level for the transition from the first specified gain to the second specified gain in the section where the amplitude of the second frequency band signal corresponds to the specified level.

For example, the control unit 770 can change the degree to which the first DRC processing unit 730 or the second DRC processing unit 735 amplifies (compresses) the first frequency band signal or the second frequency band signal by changing the first reference level or the second reference level.

In certain embodiments, the control unit 770 may compare the amplitude distribution (energy distribution) in a section of the original first frequency band signal (original second frequency band signal) with the amplitude distribution (energy distribution) in the corresponding section of the amplified first frequency band signal (amplified second frequency band signal). That is, the control unit 770 may compare the amplitude distribution of the amplified first frequency band signal or the amplified second frequency band signal with the amplitude distribution of the original first frequency band signal or the original second frequency band signal to determine the degree to which the first frequency band signal or the second frequency band signal is compressed. Upon determining that the degree to which the amplified first frequency band signal or the amplified second frequency band signal is compressed with respect to the original first frequency band signal or the original second frequency band signal is above a given level, the control unit 770 may change the first reference level, the second reference level, or the specified gain.

In certain embodiments, if most of the amplified first frequency band signal and most of the amplified second frequency band signal are within a given range of amplitude, the control unit 770 may determine that the sound is flattened without amplitude variation and the sound quality is deteriorated, and may change the first reference level, the second reference level, or the specified gain.

In at least one embodiment, the control unit 770 can control the first DRC processing unit 730 to amplify the section of the first frequency band signal corresponding to the reference level at the second specified gain. The control unit 770 can control the second DRC processing unit 735 to amplify the section of the second frequency band signal corresponding to the reference level at the third specified gain.

In some embodiments, when the sound level of the first frequency band signal or the second frequency band signal reaches a first specified level, the control unit 770 can control the first DRC processing unit 730 or the first DRC processing unit 730 to amplify the section of the signal corresponding to the first specified level at the first specified gain. In one embodiment, when the sound level of the first frequency band signal or the second frequency band signal reaches a second specified level, the control unit 770 may change the reference level for the transition from the first specified gain to the second specified gain less than the first specified gain in the section corresponding to the second specified level. The control unit 770 can control the first DRC processing unit 730 or the second DRC processing unit 735 to amplify the section of the first frequency band signal or the second frequency band signal corresponding to the second specified level at the second specified gain.

In at least one embodiment, at least some of the first filter unit 710, the second filter unit 715, the first input signal detector 720, the second input signal detector 725, the first DRC processing unit 730, the second DRC processing unit 735, the first output signal detector 740, the second output signal detector 745, the first post-processing unit 750, the second post-processing unit 755, and the control unit 770 may be implemented as one integrated module (e.g., processor 210 of FIG. 2). That is, the processor 210 shown in FIG. 2 may execute at least some or all of the operations of the first filter unit 710, the second filter unit 715, the first input signal detector 720, the second input signal detector 725, the first DRC processing unit 730, the second DRC processing unit 735, the first output signal detector 740, the second output signal detector 745, the first post-processing unit 750, the second post-processing unit 755, the mixer 760, and the control unit 770.

In some embodiments, one or more of the components of the electronic device shown in FIG. 7 may be omitted. For example, the electronic device may not include the first output signal detector 740, the second output signal detector 745, the first post-processing unit 750, or the second post-processing unit 755.

Figure 8:
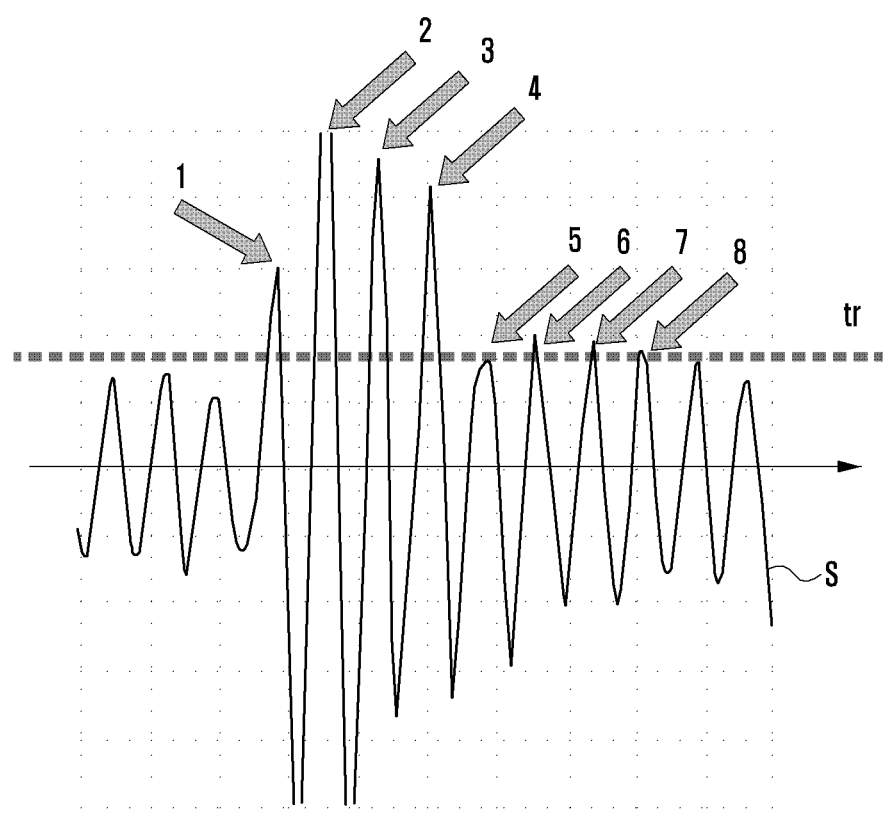
FIG. 8 illustrates operations of a method for audio signal processing by an electronic device according to certain embodiments of the present disclosure.

FIG. 8 illustrates operations of a method for audio signal processing at an electronic device according to some embodiments of the present disclosure. For example, in the non-limiting example of FIG. 8, an electronic device examines the frequency with which the amplitude of the audio signal (S) becomes higher than or equal to a specified level (tr).

In at least one embodiment, the electronic device can check the amplitude of the audio signal (S) obtained from an external object for a preset time. The electronic device may examine the frequency with which the amplitude of the audio signal (S) becomes higher than or equal to the specified level (tr). For example, the electronic device may check the amplitude of the audio signal (S) and count the frequency with which the amplitude of the audio signal (S) becomes higher than or equal to the specified level (tr) for a given time. In FIG. 8, the waveform of the audio signal (S) is shown for a specified time. The electronic device can be aware that the frequency with which the amplitude of the audio signal (S) becomes higher than or equal to the specified level (tr) is 8.

Figure 9:
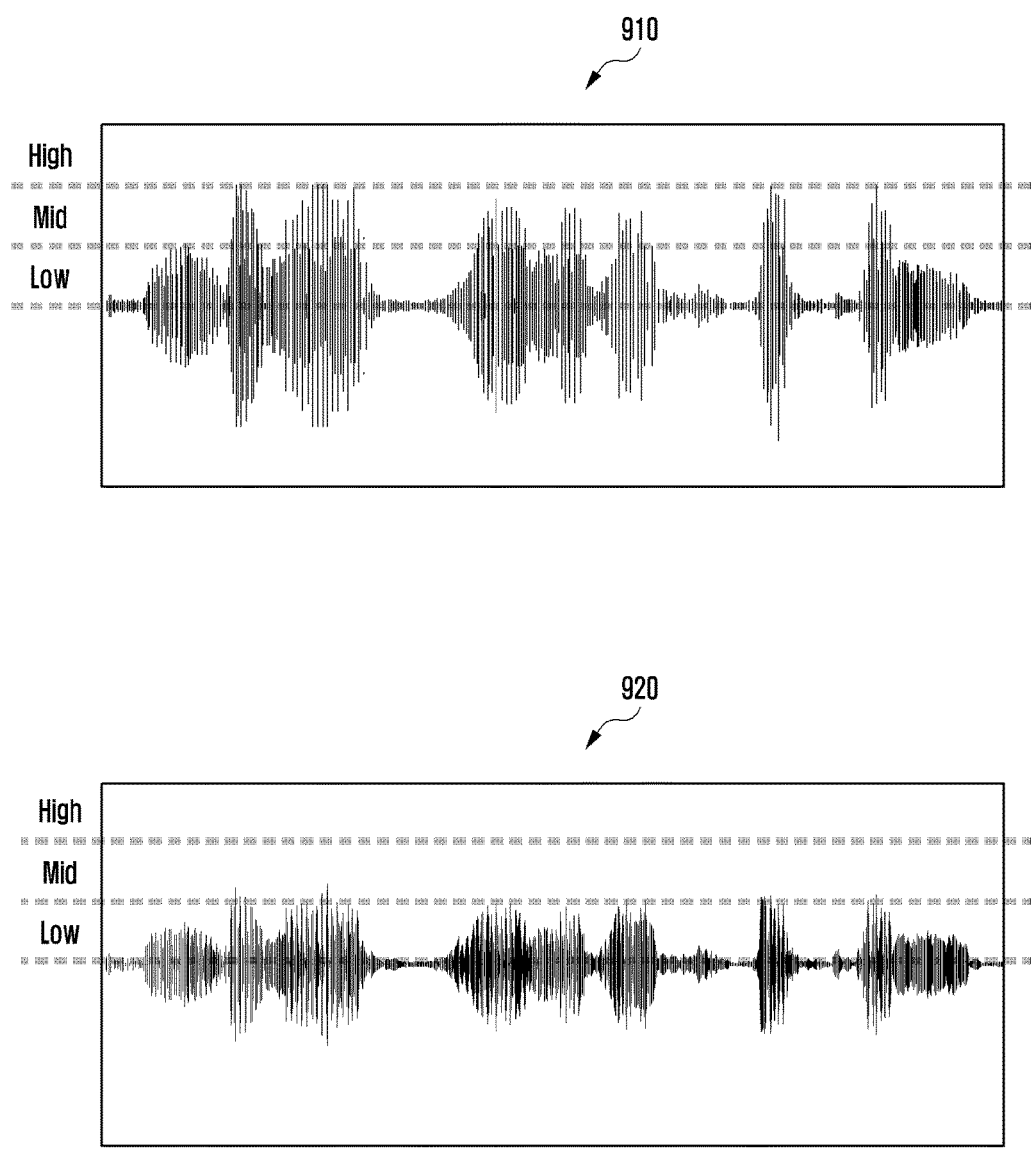
FIG. 9 illustrates audio signals processed by the electronic device according to some embodiments of the present disclosure.

FIG. 9 illustrates audio signals processed by the electronic device according to some embodiments of the present disclosure.

In at least one embodiment, an electronic device can compare the energy distribution of the original audio signal obtained from the external object with the energy distribution of the amplified audio signal. The electronic device can compare the amplitude distribution in a section of the original audio signal with the amplitude distribution in the corresponding section of the amplified audio signal. The electronic device can amplify a certain section of the audio signal whose amplitude is greater than or equal to a preset reference level at a specified gain.

For example, in the case of an audio signal represented by graph 910, it can be seen that low-amplitude components, medium-amplitude components, and high-amplitude components are evenly distributed. The audio signal 910 can maintain a waveform similar to that of the audio signal before compression. For example, in the case of an audio signal represented by graph 920, it can be seen that low- and medium-amplitude components occupy the majority of the signal. If the audio signal is mostly distributed over a certain amplitude range as indicated by indicia marked "high," "mid" and "low", the sound volume variation can be lost. For example, when the audio signal is excessively compressed or the sound quality is degraded, the audio signal may be mostly distributed over a certain amplitude range as indicated by indicia marked "high" "mid," and "low". When the original audio signal is excessively compressed and the sound volume variation is lost, the sound quality may be degraded and the user may be provided with a sound sensation different from that of the original audio signal.

In at least one embodiment, when the energy distribution of the output signal (amplified audio signal) is skewed towards a specific range compared with the energy distribution of the input signal (original audio signal), the electronic device may change the parameters used to amplify the audio signal (e.g., reference level and specified gain). For example, if the amplitude of the amplified (compressed) audio signal is mostly distributed over a certain range, as in the case of the audio signal 920, compared with the audio signal before amplification or compression, the electronic device may change the reference level and gain value to be applied to audio signal processing.

In certain embodiments, when the amplitude distribution or energy distribution of the audio signal is skewed towards a specific range, the electronic device may change the gain value used for audio signal amplification or the reference level for audio signal amplification. For example, in the case of the audio signal 920, the electronic device may lower the reference level to evenly amplify the original audio signal over a wider range. Hence, it is possible to prevent the audio signal from being excessively compressed so that the distribution of the audio signal is not concentrated only in a specific range. For example, the electronic device can adaptively adjust the compression ratio of the audio signal by reducing the specified gain applied to audio signal amplification, preventing the distribution of the audio signal from being concentrated in a specific range. That is, the electronic device can adjust the reference level or the specified gain applied to audio signal amplification so that the distribution of the audio signal can be evenly distributed over a wide range, preventing deterioration of the sound quality of the audio signal.

In various embodiments, the electronic device may change the parameters used for audio signal amplification adaptively according to the energy distributions of the original audio signal and the amplified audio signal, thereby preventing sound quality deterioration and providing better sound quality.

Figure 10:
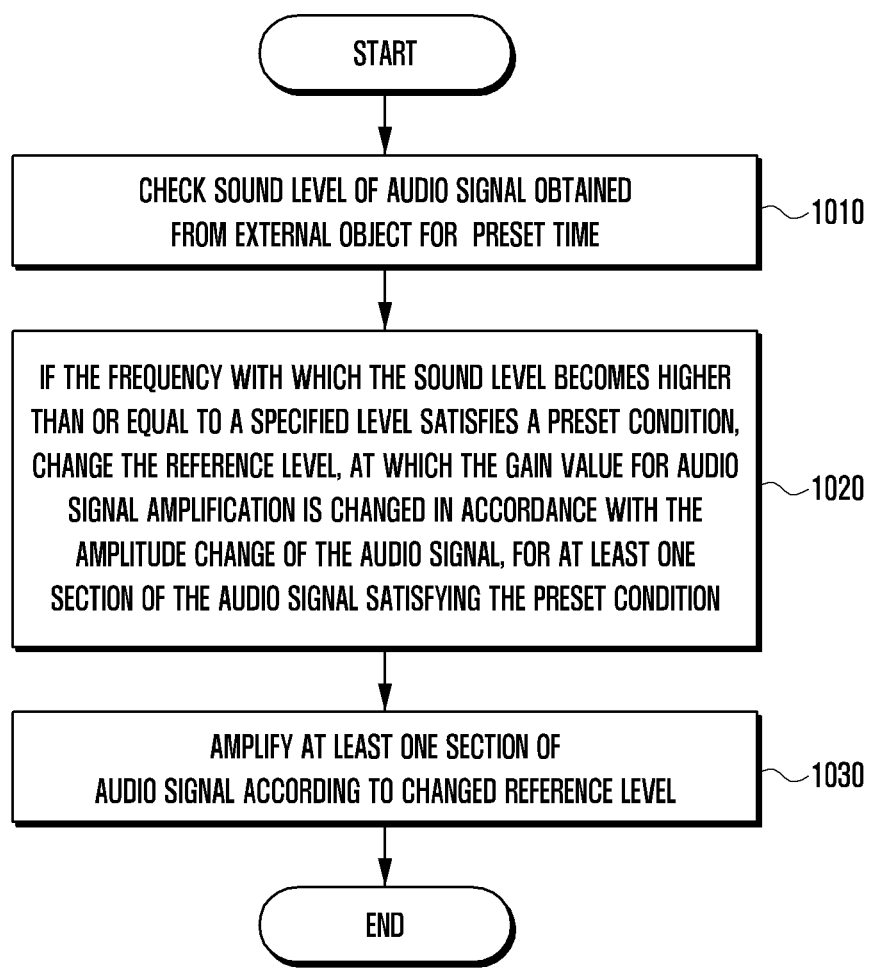
FIG. 10 illustrates operations of a method of audio signal processing method at an electronic device according to some embodiments of the present disclosure.

FIG. 10 illustrates operations of an audio signal processing method for an electronic device according to some embodiments of the present disclosure.

Referring to the non-limiting example of FIG. 10, at operation 1010, the electronic device can check the sound level of the audio signal obtained from an external object for a preset time. For example, the electronic device can pick up a sound from the outside using a microphone and obtain an audio signal corresponding to the picked-up sound. Here, the preset time can be specified differently according to the settings of the user or the electronic device.

In at least one embodiment, the electronic device may check the level of the sound for at least a part of the audio signal. The electronic device may examine the waveform (e.g., amplitude) of the audio signal.

At operation 1020, the electronic device may determine whether the frequency with which the sound level of the audio signal becomes higher than or equal to a specified level satisfies a preset condition. Here, the specified level can indicate the level at which the sound volume is saturated. The specified level may be set to the threshold for acceptable amplitudes in audio-related components (e.g., microphone) of the electronic device. If the specified level is exceeded, the audio signal may be clipped. The specified level can be set differently according to user input or settings of the electronic device. Here, the preset condition can be satisfied when the above frequency is greater than or equal to a preset value.

In certain embodiments, if the preset condition is satisfied, the electronic device may change the reference level, at which the gain value for audio signal amplification is changed in accordance with the amplitude change of the audio signal, for at least a part of the audio signal satisfying the preset condition. Here, the reference level may be used to apply different gains depending on the amplitude of the audio signal. The reference level may be used for the transition from the first specified gain to the second specified gain in accordance with the amplitude of the audio signal (e.g., reference value corresponding to the amplitude of the audio signal). For example, the electronic device may adaptively change the level of the sound (i.e., the reference level) for changing the gain applied to the audio signal according to the state (e.g., size distribution or energy distribution) of the obtained audio signal.

At operation 1030, the electronic device may amplify at least a portion of the audio signal according to the changed reference level. For example, the electronic device may amplify a section of the audio signal whose amplitude is greater than or equal to the changed reference level at a second specified gain. The electronic device may amplify a section of the audio signal whose amplitude is less than the changed reference level at a first specified gain. Here, the first specified gain may be 1. The electronic device may maintain the section of the audio signal whose amplitude is less than the reference level as it is, and may amplify the section of the audio signal whose amplitude is greater than or equal to the reference level at a specified gain (e.g., second specified gain).

In at least one embodiment, the electronic device can adaptively change the reference level and compress the audio signal appropriately according to the situation, providing optimum sound quality. For example, the electronic device can adjust the reference level to adaptively compress the audio signal while maintaining even distribution of the audio signal (evenly distributed waveform).

Figure 11:
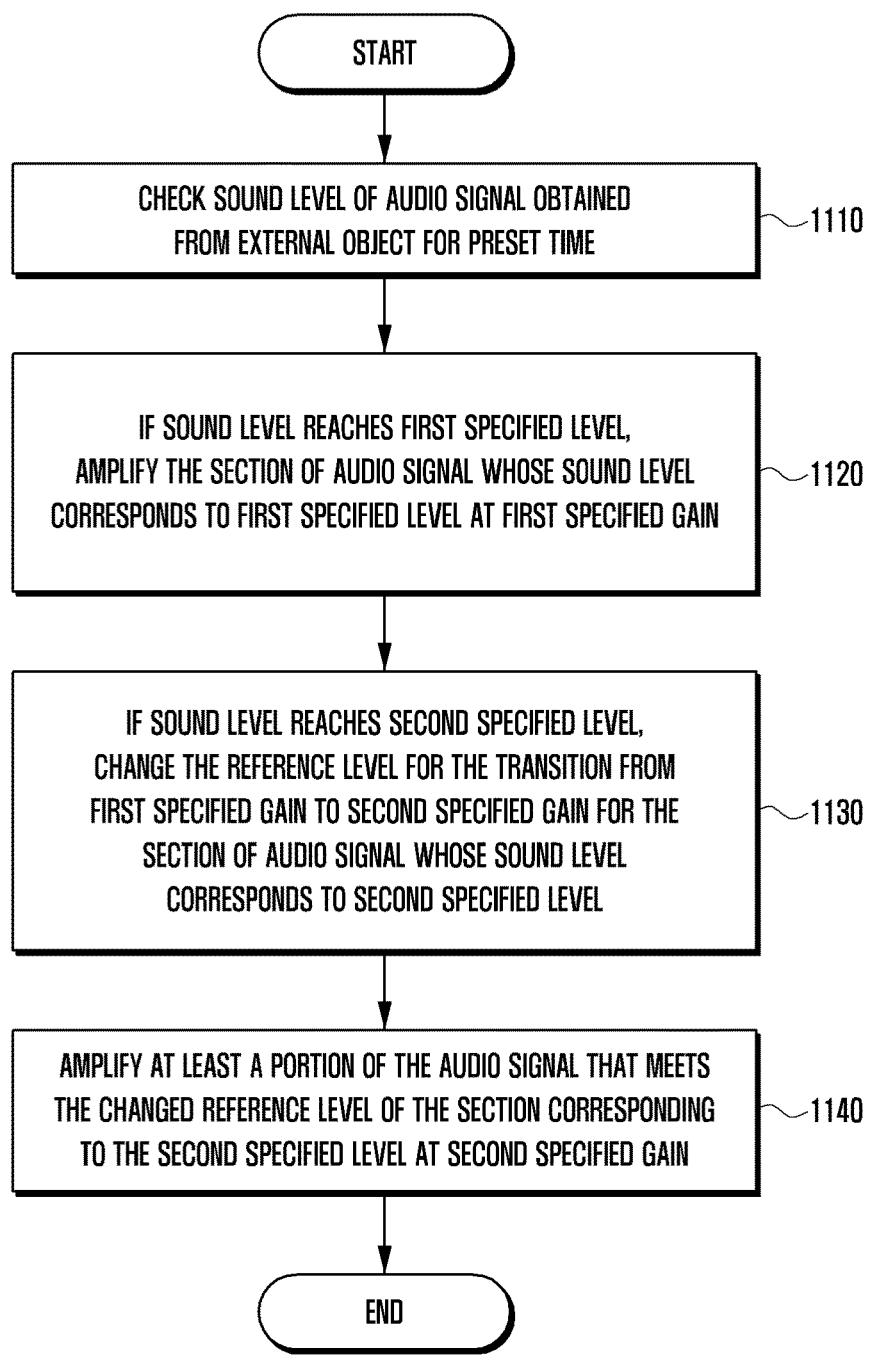
FIG. 11 illustrates operations of an audio signal processing method at an electronic device according to certain embodiments of the present disclosure.

FIG. 11 illustrates operations of an audio signal processing method at an electronic device according to some embodiments of the present disclosure.

Referring to the non-limiting example of FIG. 11, at operation 1110, the electronic device can check the sound level of the audio signal obtained from an external object for a preset time. The electronic device may check the level of the sound for at least a part of the audio signal. The electronic device may examine the waveform (e.g., amplitude) of the audio signal.

At operation 1120, if the level of the sound reaches a first specified level, the electronic device may amplify the section of the audio signal whose sound level corresponds to the first specified level at a first specified gain.

At operation 1130, if the level of the sound reaches a second specified level, the electronic device may change the reference level for the transition from the first specified gain to the second specified gain for the section of the audio signal where the sound level corresponds to the second specified level. In one embodiment, the second specified level may be greater than the first specified level. The reference level may be used to apply different gains depending on the amplitude of the audio signal. The electronic device may adaptively change the level of the sound (i.e., the reference level) for changing the gain applied to the audio signal according to the state (e.g., size distribution or energy distribution) of the obtained audio signal.

At operation 1140, the electronic device may amplify at least a portion of the audio signal that meets the changed reference level of the section corresponding to the second specified level. For example, the electronic device can amplify the section of the audio signal, corresponding to the second specified level and whose amplitude is equal to or greater than the reference level, at the second specified gain. The electronic device can amplify the section of the audio signal, corresponding to the second specified level and whose amplitude is less than the reference level, at the first specified gain.

In at least one embodiment, the electronic device can adaptively amplify the audio signal according to the surrounding conditions by changing the reference level for applying different gains depending upon the amplitude and distribution of the audio signal.

According to various embodiments of the present disclosure, the audio signal processing method for the electronic device may include examining the sound level of an audio signal obtained from an external object for a preset time; changing, if the frequency with which the sound level becomes higher than or equal to a specified level satisfies a preset condition, a reference level for the transition from a first specified gain to a second specified gain, for the section of the audio signal whose sound level corresponds to the specified level; and amplifying at least a portion of the audio signal that meets the changed reference level of the section corresponding to the specified level at the second specified gain.

In at least one embodiment, changing a reference level may include changing the second specified gain to a value smaller than the first specified gain.

In certain embodiments, the method may further include determining the second specified gain according to the changed reference level.

In various embodiments, the method may further include: filtering the obtained audio signal into a first frequency band signal and a second frequency band signal by using a filter prior to examining; and performing the above operations of examining, changing, and amplifying for each of the first frequency band signal and the second frequency band signal.

In some embodiments, the method may further include mixing the amplified first frequency band signal and the amplified second frequency band signal together to generate an amplified audio signal of the overall frequency band.

In at least one embodiment, the method may further include: comparing the energy distribution of at least one section of the obtained audio signal with the energy distribution of at least one section of the amplified audio signal corresponding to the at least one section of the obtained audio signal; and changing at least one of the reference level, the first specified gain, and the second specified gain on the basis of the comparison result.

In various embodiments, the method may further include identifying the sound level of at least one section of the amplified audio signal; and post-processing the amplified audio signal according to the identified sound level.

In at least one embodiment, the method may further include changing the first specified gain or the second specified gain according to an audio-related function being executed in the electronic device.

The term "module," as used in the present disclosure encompasses a unit including a combination of at least one of, for example, hardware, software, or firmware. The "module" may be interchangeably used with a term such as a unit, logic, a logical block, a component, or a circuit. The "module" may be a minimum unit or a portion of an integrally formed component. The "module" may be a minimum unit or a portion that performs at least one function. The "module" may be mechanically or electronically implemented. For example, a "module" according to an exemplary embodiment of the present disclosure may include at least one of an Application-Specific Integrated Circuit (ASIC) chip, Field-Programmable Gate Arrays (FPGAs), or a programmable-logic device that performs any operation known or to be developed.

According to various exemplary embodiments, at least a portion of a method (e.g., operations) or a device (e.g., modules or functions thereof) according to the present disclosure may be implemented with an instruction stored at computer-readable storage media in a form of, for example, a programming module. When the instruction is executed by at least one processor (e.g., the processor 120), the at least one processor may perform a function corresponding to the instruction. The computer-readable storage media may be, for example, the memory 130. At least a portion of the programming module may be implemented (e.g., executed) by, for example, the processor 120. At least a portion of the programming module may include, for example, a module, a program, a routine, sets of instructions, or a process that performs at least one function.

The computer-readable storage media may include magnetic media such as a hard disk, floppy disk, and magnetic tape, optical media such as a Compact Disc Read Only memory (CD-ROM) and a Digital Versatile Disc (DVD), magneto-optical media such as a floptical disk, and a hardware device, specially formed to store and perform a program instruction (e.g., a programming module), such as a Read Only memory (ROM), a Random Access memory (RAM), a flash memory. Further, a program instruction may include a high-level language code that may be executed by a computer using an interpreter as well as a machine language code generated by a compiler. In order to perform operation of the present disclosure, the above-described hardware device may be formed to operate as at least one software module, and vice versa.

A module or a programming module according to the present disclosure may include at least one of the foregoing constituent elements, may omit some constituent elements, or may further include additional other constituent elements. Operations performed by a module, a programming module, or another constituent element according to the present disclosure may be executed with a sequential, parallel, repeated, or heuristic method. Further, some operations may be executed in different orders, may be omitted, or may add other operations.

According to various exemplary embodiments, in a storage medium that stores instructions, when the instructions are executed by at least one processor, the instructions are set to enable the at least one processor to perform at least one operation, wherein the at least one operation may include operation of acquiring, by a first electronic device, address information of a second electronic device and location information of at least one application to be executed by interlocking with at least the second electronic device through first short range communication with the outside; operation of connecting, by the first electronic device, second distance communication with the second electronic device based on the address information; operation of receiving, by the first electronic device, the application from the outside based on the location information; and operation of executing, by the first electronic device, the application by interlocking with the second electronic device through the second distance communication.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising a processor, wherein the processor is configured to:
    examine a sound level of an audio signal for a preset time, the audio signal obtained from an external source;
    check if a frequency with which the examined sound level becomes higher than or equal to a specified level satisfies a preset condition;
    change, if the frequency with which the examined sound level becomes higher than or equal to the specified level satisfies the preset condition, a reference level at which a gain value for audio signal amplification is changed in accordance with an amplitude change of the audio signal, for at least one section of the audio signal satisfying the preset condition; and
    amplify the at least one section of the audio signal according to the changed reference level.

2. An electronic device comprising a processor, wherein the processor is configured to:
    filter an audio signal obtained from an external source into a first frequency band signal and a second frequency band signal by using a filter, and for each of the first frequency band signal and second frequency band signal:
    examine a sound level of a frequency band signal for a preset time;
    check if a frequency with which the examined sound level becomes higher than or equal to a specified level satisfies a preset condition;
    change, if the frequency with which the examined sound level becomes higher than or equal to the specified level satisfies the preset condition, a reference level at which a gain value for audio signal amplification is changed in accordance with an amplitude change of the frequency band signal, for at least one section of the frequency band signal satisfying the preset condition; and
    amplify the at least one section of the frequency band signal according to the changed reference level.

3. The electronic device of claim 2, wherein the processor is configured to mix the amplified first frequency band signal and the amplified second frequency band signal together to generate an amplified audio signal of an overall frequency band.

4. The electronic device of claim 1, wherein the processor is configured to identify a sound level of at least one section of the amplified audio signal, and post-process the amplified audio signal according to the identified sound level.

5. The electronic device of claim 1, wherein the processor is configured to change the gain value for audio signal amplification from a first specified gain to a second specified gain according to the changed reference level, and wherein the second specified gain is set to be smaller than the first specified gain.

6. The electronic device of claim 5, wherein the processor is configured to determine the second specified gain according to the changed reference level.

7. The electronic device of claim 5, wherein the processor is configured to:
    perform a comparison of an energy distribution of at least one section of the obtained audio signal with an energy distribution of at least one section of the amplified audio signal corresponding to the at least one section of the obtained audio signal to obtain a result, and
    change at least one of the reference level, the first specified gain, and the second specified gain based at least in part on the result of the comparison.

8. The electronic device of claim 5, wherein the processor is configured to change the first specified gain or the second specified gain according to an audio-related function being executed in the electronic device.

9. An electronic device comprising a processor wherein the processor is configured to:
    examine a sound level of an audio signal obtained from an external source for a preset time and check if the examined sound level meets a first specified level or a second specified level;
    amplify, if the examined sound level meets the first specified level, a section of the audio signal whose sound level corresponds to the first specified level at a first specified gain;
    change, if the examined sound level meets the second specified level, a reference level for a transition from the first specified gain to a second specified gain less than the first specified gain for the section of the audio signal where the sound level corresponds to the second specified level, and amplify at least a portion of the audio signal that meets the changed reference level of the section corresponding to the second specified level at the second specified gain.

10. The electronic device of claim 9, wherein the processor is configured to determine the second specified gain according to the changed reference level.

11. An electronic device comprising a processor, wherein the processor is configured to:
  filter an audio signal obtained from an external source into a first frequency band signal and a second frequency band signal by using a filter;
  for each of the first frequency band signal and the second frequency band signal:
    examine a sound level of a frequency band signal for a preset time and check if the examined sound level meets a first specified level or a second specified level;
    amplify, if the examined sound level meets the first specified level, a section of the frequency band signal whose sound level corresponds to the first specified level at a first specified gain;
    change, if the examined sound level meets the second specified level, a reference level for a transition from the first specified gain to a second specified gain less than the first specified gain for the section of the frequency band signal where the sound level corresponds to the second specified level; and
    amplify at least a portion of the frequency band signal that meets the changed reference level of the section corresponding to the second specified level at the second specified gain; and
  mix the amplified first frequency band signal and the amplified second frequency band signal together to generate an amplified audio signal of an overall frequency band.

12. The electronic device of claim 9, wherein the processor is configured to examine an energy distribution of the amplified audio signal, and change at least one of the reference level, the first specified gain, and the second specified gain on a basis of the examined energy distribution.

13. A method of audio signal processing for an electronic device, the method comprising:
  examining a sound level of an audio signal obtained from an external source for a preset time and checking if a frequency with which the examined sound level becomes higher than or equal to a specified level satisfies a preset condition;
  changing, if the frequency with which the examined sound level becomes higher than or equal to the specified level satisfies the preset condition, a reference level for a transition from a first specified gain to a second specified gain, for a section of the audio signal whose sound level corresponds to the specified level; and
  amplifying at least a portion of the audio signal that meets the changed reference level of the section corresponding to the specified level at the second specified gain.

14. The method of claim 13, wherein changing a reference level comprises changing the second specified gain to a value smaller than the first specified gain.

15. The method of claim 13, further comprising determining the second specified gain according to the changed reference level.

16. A method of audio signal processing for an electronic device, the method comprising:
  filtering an obtained audio signal into a first frequency band signal and a second frequency band signal by using a filter prior to examining; and
  for each of the first frequency band signal and the second frequency band signal:
    examining a sound level of the frequency band signal for a preset time and checking if a frequency with which the examined sound level becomes higher than or equal to a specified level satisfies a preset condition;
    changing, if the frequency with which the examined sound level becomes higher than or equal to the specified level satisfies the preset condition, a reference level for a transition from a first specified gain to a second specified gain, for a section of the frequency band signal whose sound level corresponds to the specified level; and
    amplifying at least a portion of the frequency band signal that meets the changed reference level of the section corresponding to the specified level at the second specified gain.

17. The method of claim 16, further comprising mixing the amplified first frequency band signal and the amplified second frequency band signal together to generate an amplified audio signal of an overall frequency band.

18. The method of claim 13, further comprising:
  performing a comparison of an energy distribution of at least one section of the obtained audio signal with an energy distribution of at least one section of the amplified audio signal corresponding to the at least one section of the obtained audio signal to obtain a result; and
  changing at least one of the reference level, the first specified gain, and the second specified gain on a basis of the result of the comparison.

19. The method of claim 13, further comprising:
  identifying a sound level of at least one section of the amplified audio signal; and
  post-processing the amplified audio signal according to the identified sound level.

20. The method of claim 13, further comprising changing the first specified gain or the second specified gain according to an audio-related function being executed in the electronic device.

* * * * *